United States Patent
Chandolu et al.

(10) Patent No.: US 11,101,280 B2
(45) Date of Patent: Aug. 24, 2021

(54) MEMORY ARRAYS AND METHODS USED IN FORMING A MEMORY ARRAY

(71) Applicant: Micron Technology, Inc., Boise, ID (US)

(72) Inventors: Anilkumar Chandolu, Boise, ID (US); S.M. Istiaque Hossain, Boise, ID (US); Darwin A. Clampitt, Wilder, ID (US); Arun Kumar Dhayalan, Boise, ID (US); Kevin R. Gast, Boise, ID (US); Christopher Larsen, Boise, ID (US); Prakash Rau Mokhna Rau, Boise, ID (US); Shashank Saraf, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/728,723

(22) Filed: Dec. 27, 2019

(65) Prior Publication Data

US 2021/0202515 A1    Jul. 1, 2021

(51) Int. Cl.
*H01L 27/115*    (2017.01)
*H01L 27/11556*    (2017.01)
(Continued)

(52) U.S. Cl.
CPC .. *H01L 27/11556* (2013.01); *H01L 21/76802* (2013.01); *H01L 23/5226* (2013.01);
(Continued)

(58) Field of Classification Search
CPC ..................... H01L 27/11556; H01L 23/53295
See application file for complete search history.

(56) References Cited

U.S. PATENT DOCUMENTS 9,412,752 B1 * 8/2016 Yeh .................. H01L 29/42348
2017/0301685 A1    10/2017 Dorhout et al.

OTHER PUBLICATIONS

U.S. Appl. No. 16/230,382, filed Dec. 21, 2018, by Dorhout et al.
(Continued)

*Primary Examiner* — William Coleman
(74) *Attorney, Agent, or Firm* — Wells St. John P.S.

(57) ABSTRACT

A method used in forming a memory array comprising strings of memory cells comprises forming a stack comprising vertically-alternating first tiers and second tiers comprising memory-block regions having channel-material strings therein. Conductor-material contacts are directly against the channel material of individual of the channel-material strings. First insulator material is formed directly above the conductor-material contacts. The first insulator material comprises at least one of (a) and (b), where (a): silicon, nitrogen, and one or more of carbon, oxygen, boron, and phosphorus, and (b): silicon carbide. Second insulator material is formed directly above the first insulator material and the conductor-material contacts. The second insulator material is devoid of each of the (a) and (b). Third insulator material is formed directly above the second insulator material, the first insulator material, and the conductor-material contacts. The third insulator material comprises at least one of the (a) and (b). At least one horizontally-elongated isolation structure is formed in the first and second insulator materials and in a top part of the stack in individual of the memory-block regions. Additional methods, including structure independent of method, are disclosed.

42 Claims, 19 Drawing Sheets

(51) Int. Cl.
    *H01L 27/11582* (2017.01)
    *H01L 27/11519* (2017.01)
    *H01L 21/768* (2006.01)
    *H01L 23/522* (2006.01)
    *H01L 23/532* (2006.01)
    *H01L 27/11565* (2017.01)
    *H01L 21/311* (2006.01)

(52) U.S. Cl.
    CPC .. *H01L 23/53295* (2013.01); *H01L 27/11519* (2013.01); *H01L 27/11565* (2013.01); *H01L 27/11582* (2013.01); H01L 21/31116 (2013.01)

(56) References Cited

OTHER PUBLICATIONS

U.S. Appl. No. 16/574,417, filed Sep. 18, 2019, by Hopkins et al.
U.S. Appl. No. 16/675,901, filed Nov. 6, 2019, by Hopkins et al.
U.S. Appl. No. 16/682,349, filed Nov. 13, 2019, by Kong et al.
U.S. Appl. No. 16/682,544, filed Nov. 13, 2019, by Bhushan et al.

\* cited by examiner

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-13 and 38 which may be considered as a "gate-last" or "replacement-gate" process, and starting with FIGS. 1-4.

Figure 1:
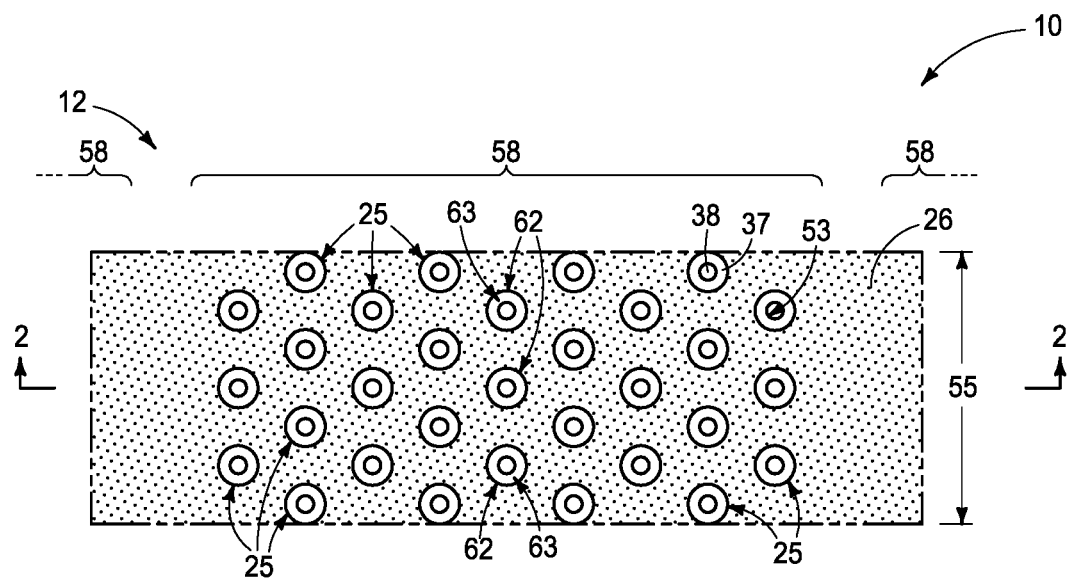
FIG. 1 is a diagrammatic cross-sectional view of a portion of a substrate in process in accordance with an embodiment of the invention and is taken through line 1-1 in FIG. 2.
Figure 2:
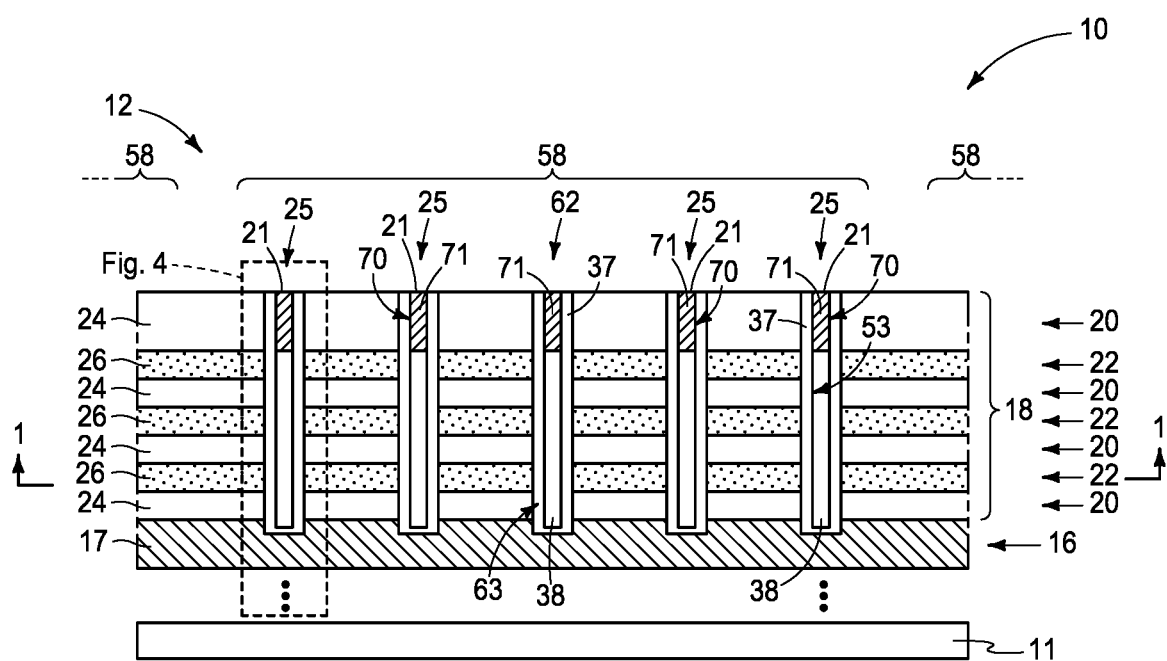
FIG. 2 is a diagrammatic cross-sectional view taken through line 2-2 in FIG. 1.
Figure 3:
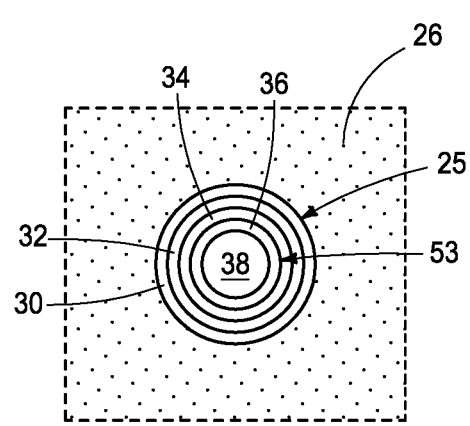
FIGS. 3 and 4 are enlarged views of portions of FIGS. 1 and 2.
Figure 4:
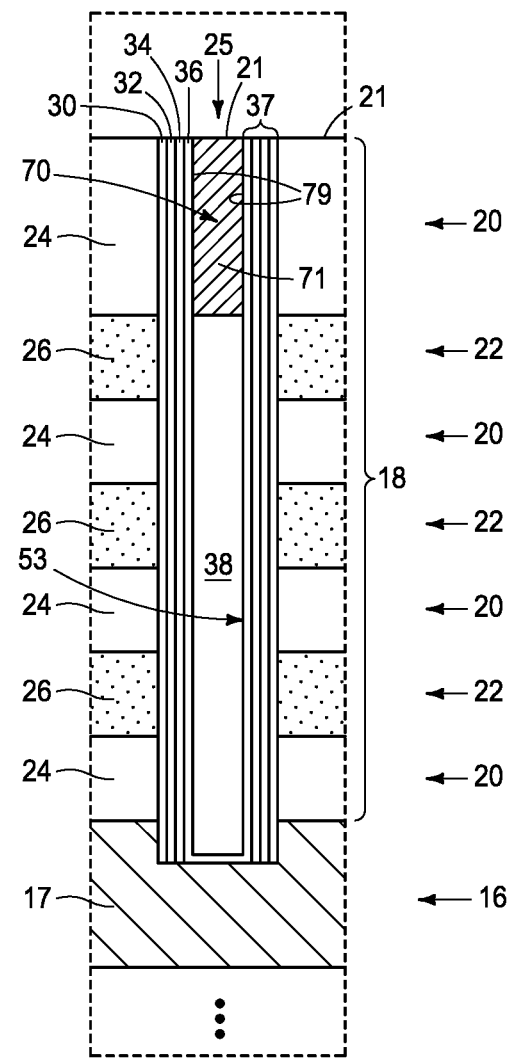

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 and dummy-structure openings 62 have been formed (e.g., by etching) through insulative tiers 20 and conductive tiers 22 to conductor tier 16. In this document, a "dummy-structure opening" is an opening in which a "dummy structure" has been or will be formed. A "dummy structure" is a circuit-inoperative structure that may be in a finished circuitry construction and, if so, in all operation of the circuitry has no current flow there-through and which may be a circuit inoperable dead end that is not part of a current flow path of a circuit even if extending to or from an electronic component. Dummy-structure openings 62 may be optionally provided for process uniformity in forming operative channel openings 25 and material therein. Openings 25 and 62 may taper radially-inward (not shown) moving deeper in stack 18. In some embodiments, openings 25 and 62 may go into conductor material 17 of conductor tier 16 as shown or may stop there-atop (not shown). Alternately, as an example, openings 25 and 62 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired.

Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, openings 25/62 are shown as being arranged in groups or columns of staggered rows of four and five openings 25/62 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-4 show one embodiment wherein charge-blocking material 30, storage material 32, and charge-passage material 34 have been formed in individual openings 25 and 62 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 and 62 followed by planarizing such back at least to a top surface of stack 18.

Channel material 36 has also been formed in openings 25 and 62 elevationally along insulative tiers 20 and conductive tiers 22, thus comprising individual operative channel-material strings 53 in channel openings 25 and dummy structures 63 in dummy-structure openings 62. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Regardless, conductor-material contacts 70 (e.g., comprising conductor material 71) are directly against channel material 36 of individual channel-material strings 53 (e.g., radially-inward of and directly against radially-inner sides 79 of channel material 36). Conductor-material contacts 70 may be considered as comprising tops 21. One or more of materials 30, 32, 34, and 36 may not extend to the top of conducting material 71 (not shown). Further, and regardless, conducting material 71 may not extend to the top of stack 18 (not shown), may extend above stack 18 (not shown), and/or may extend below the bottom of uppermost tier 20 (not shown). Dummy structures 63 may have the same configuration as the materials in channel openings 25.

Figure 5:
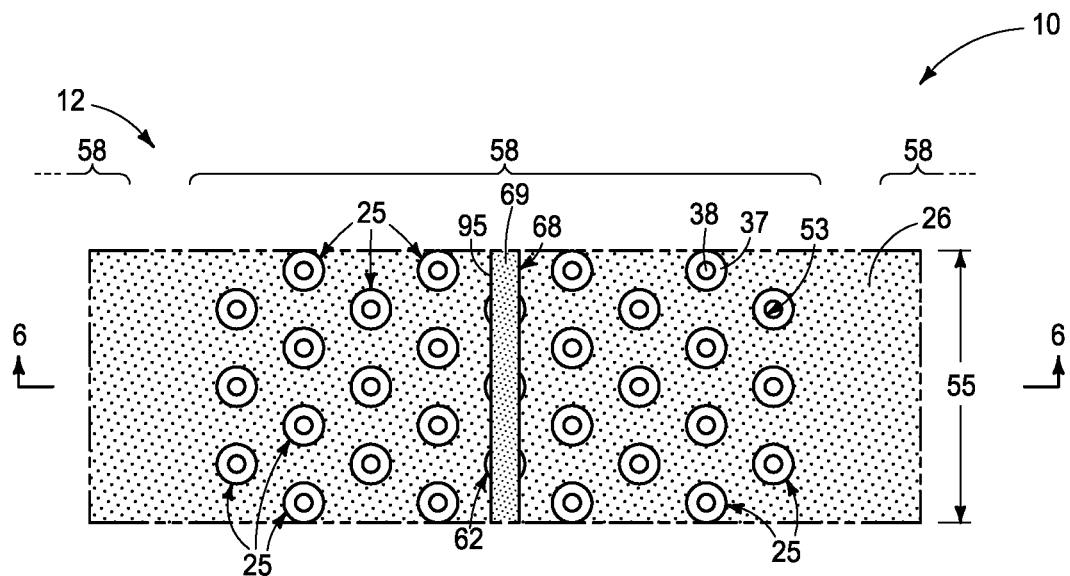
FIGS. 5-13 are diagrammatic sequential sectional, expanded, enlarged, and/or partial views of the construction of FIGS. 1-4, or portions thereof, in process in accordance with some embodiments of the invention.
Figure 6:
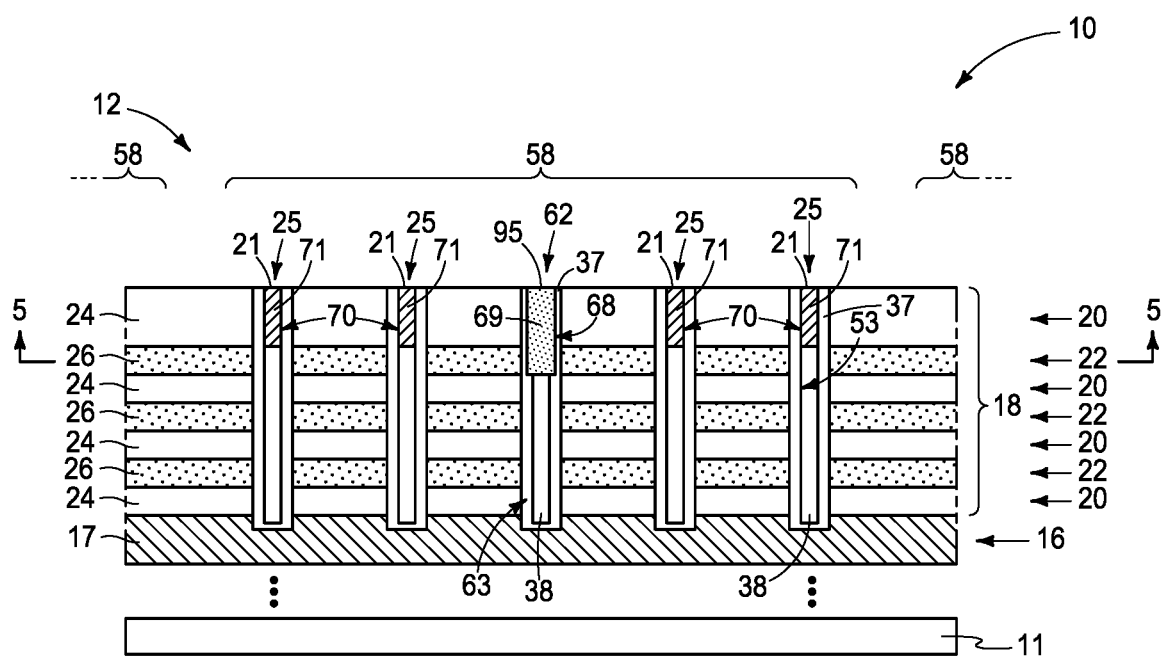

Referring to FIGS. 5 and 6, at least one horizontally-elongated isolation structure 95 (only one being shown) has been formed in a top part of stack 18 in individual memory-block regions 58. An example manner of forming isolation structure(s) 95 is to form a horizontally-elongated isolation trench 68 in a top part of stack 18 and filling such with insulating material 69 (e.g., silicon dioxide). Isolation structure 95 may be laterally-between two immediately-laterally adjacent select gates (not yet shown) in individual memory blocks 58 in a finished circuitry construction. More than one isolation structure 95 may be provided (not shown), for example two isolation structures separating a total of three select gates in individual memory blocks, three isolation structures separating a total of four select gates in individual memory blocks, etc. The at least one isolation structure 95, channel-material strings 53, and/or dummy structures 63 may have been formed before or after patterning steps/stairs in a staircase area (not shown) that is not otherwise particularly relevant to aspects of the inventions disclosed herein.

Figure 7:
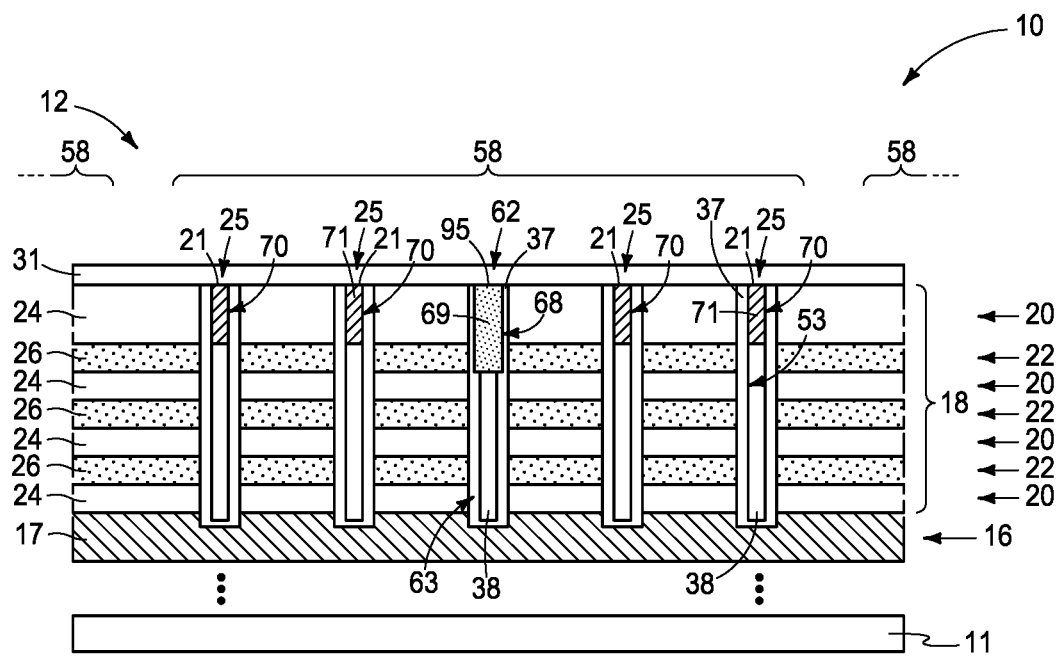

Referring to FIG. 7, insulator material 31 (in some embodiments referred to as first insulator material 31) (e.g., 200 to 300 Angstroms) has been formed directly above conductor-material contacts 70 and the at least one isolation structure 95. Insulator material 31 may be formed directly against conductor-material contact 70 and/or the at least one isolation structure 95 in some embodiments. Insulator material 31 comprises at least one of (a) and (b), where (a): silicon, nitrogen, and one or more of carbon, oxygen, boron, and phosphorus, and (b): silicon carbide. Insulator material 31 may comprise just one of the (a) or (b), or both.

Conductive vias are formed through insulator material 31 that are individually directly against individual conductor-material contacts 70. An example manner of doing so is described next with reference to FIGS. 8-13.

Figure 8:
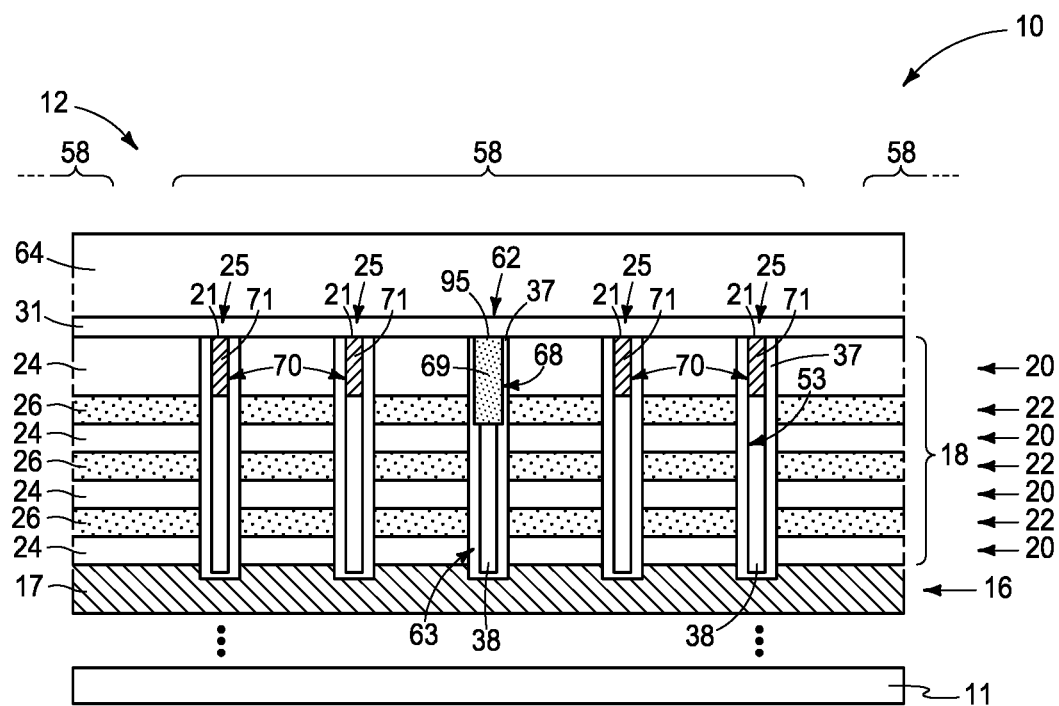

FIG. 8 shows forming insulating material 64 (in some embodiments referred to as second insulator material 64) directly above, and in one embodiment directly against, insulator material 31. Insulating material 64 is devoid of each of the (a) and (b). An example insulating material 64 is doped or undoped silicon dioxide.

Figure 9:
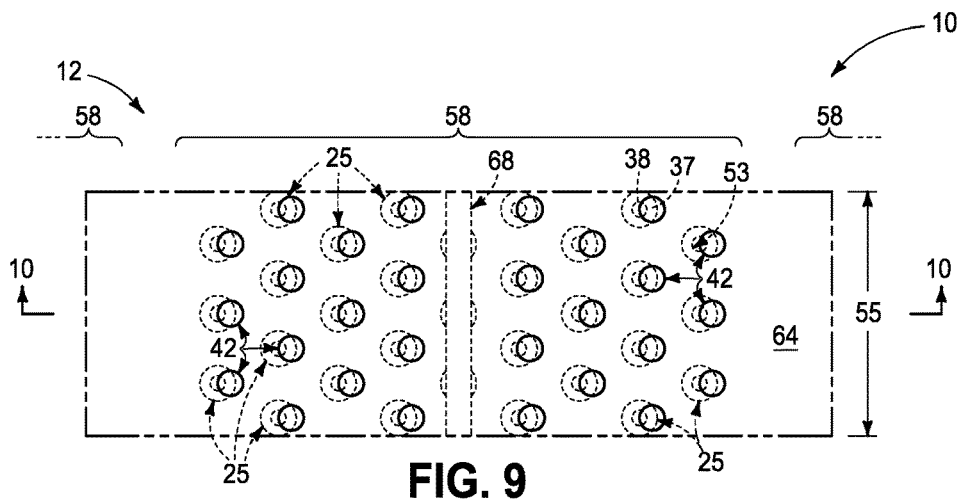
Figure 10:
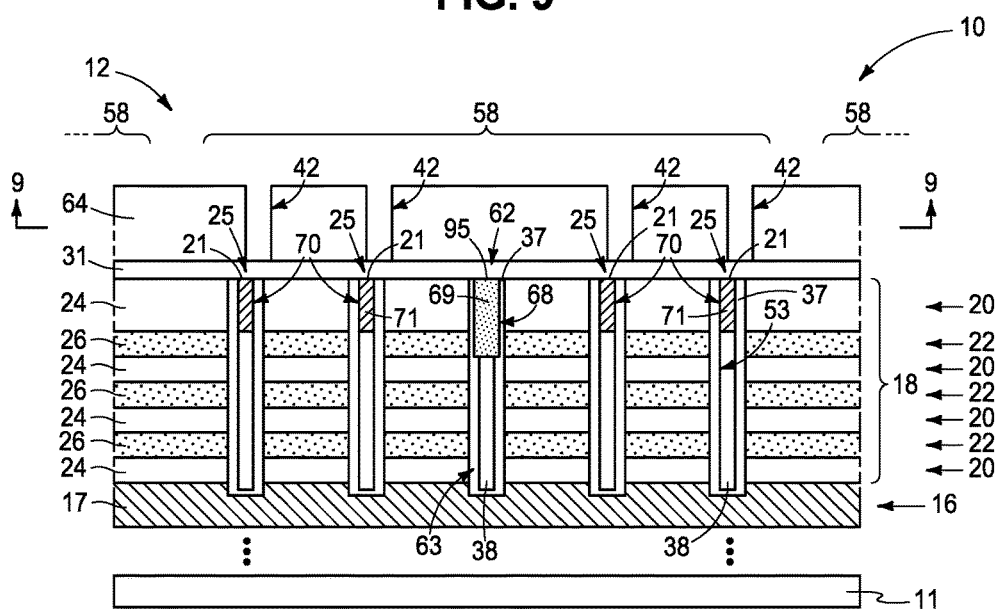

Conductive via openings are formed through insulating material 64 and insulator material 31 to individual conductor-material contacts 70. Referring to FIGS. 9 and 10, and in one such embodiment, such shows forming of such conductive via openings 42 as comprising anisotropically etching through insulating material 64 selectively relative to insulator material 31 using a first etching chemistry to stop on or in insulator material 31. An example such dry first etching chemistry where insulating material 64 is silicon dioxide and insulator material 31 is either the (a) or (b) is $C_xF_y$ with some $O_2$. Conductive via openings 42 may be formed by, for example, photolithographic patterning and etch with or without using hard-masking material(s). Example conductive via openings 42 are shown, by way of example, as being slightly but acceptably mis-aligned to the right relative to conductor-material contacts 70.

Figure 11:
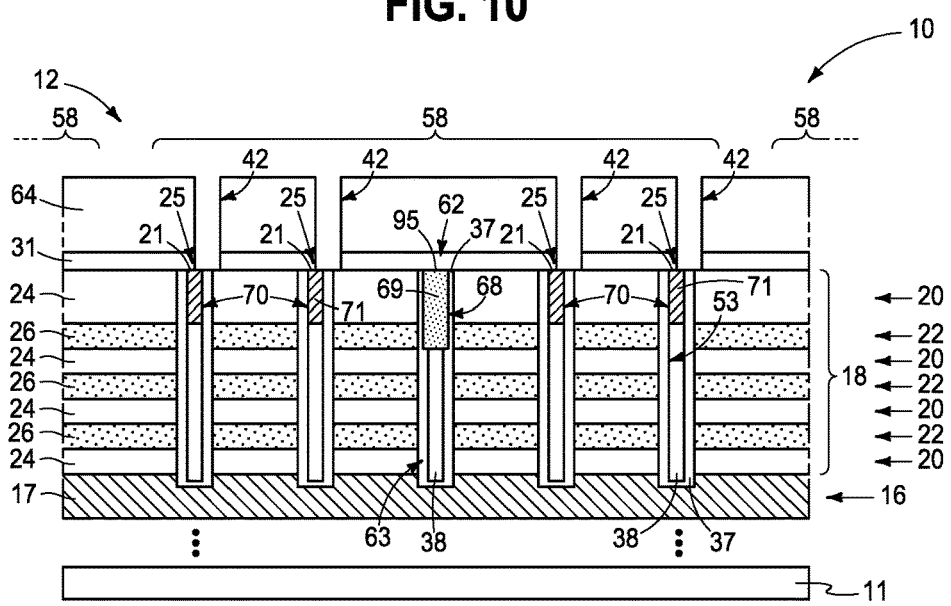

Referring to FIG. 11, insulator material 31 has been etched through using a second etching chemistry that is different from the first etching chemistry to expose individual conductor-material contacts 70. An example dry second etching chemistry where insulator material 31 is either the (a) or (b) is $CF_4$ with some $CH_xF_y$.

Figure 12:
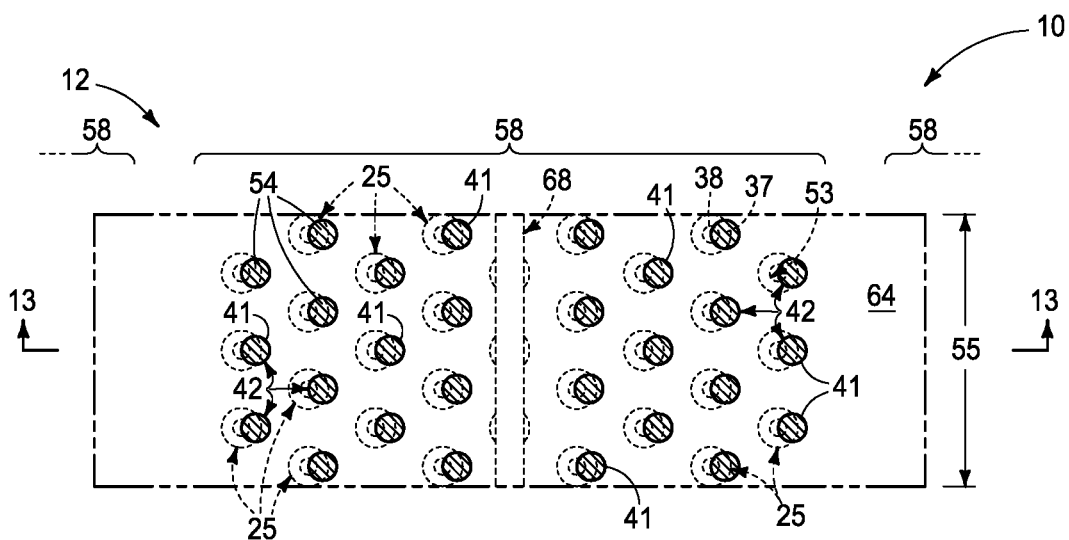
Figure 13:
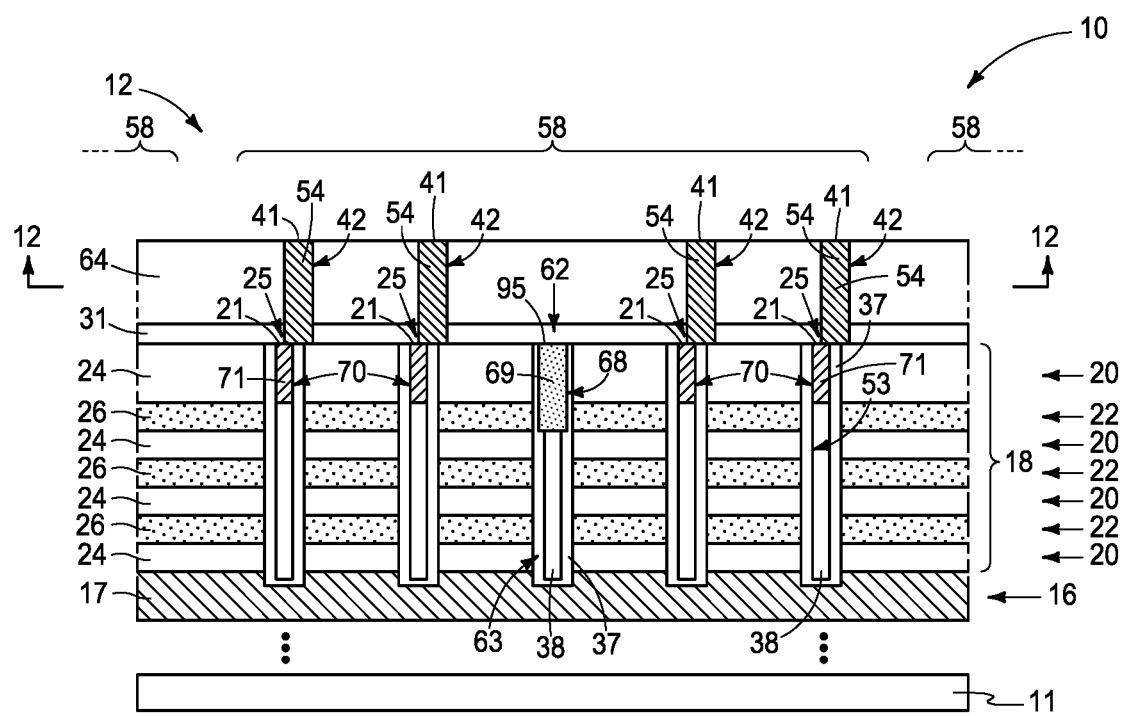

Referring to FIGS. 12 and 13, conductive material 54 has been formed in conductive via openings 42 to be directly against individual conductor-material contacts 70, thereby forming conductive vias 41. By way of example only, conductive material 54 may be deposited to initially over-fill conductive via openings 42 followed by polishing such back at least to the outer surface of insulating material 64.

For simplicity and clarity in the figures, contacts 70 and vias 41 are shown as being of the same shape in horizontal and vertical cross-sections, with vias 41 being larger in horizontal cross-section than that of contacts 70. Further, and regardless, the respective sizes and shapes need not be constant (although constant is shown) in different horizontal and/or vertical cross-sections through the centers of contacts 70 and vias 41.

Any other attribute(s) or aspect(s) as shown and/or described herein with respect to other embodiments may be used in the embodiments shown and described with reference to the above embodiments.

An alternate example method used in forming a memory array is next described with reference to FIGS. 14-37. Like numerals from the above-described embodiments have been used where appropriate, with some construction differences being indicated with the suffix "a" or with different numerals.

Figure 14:
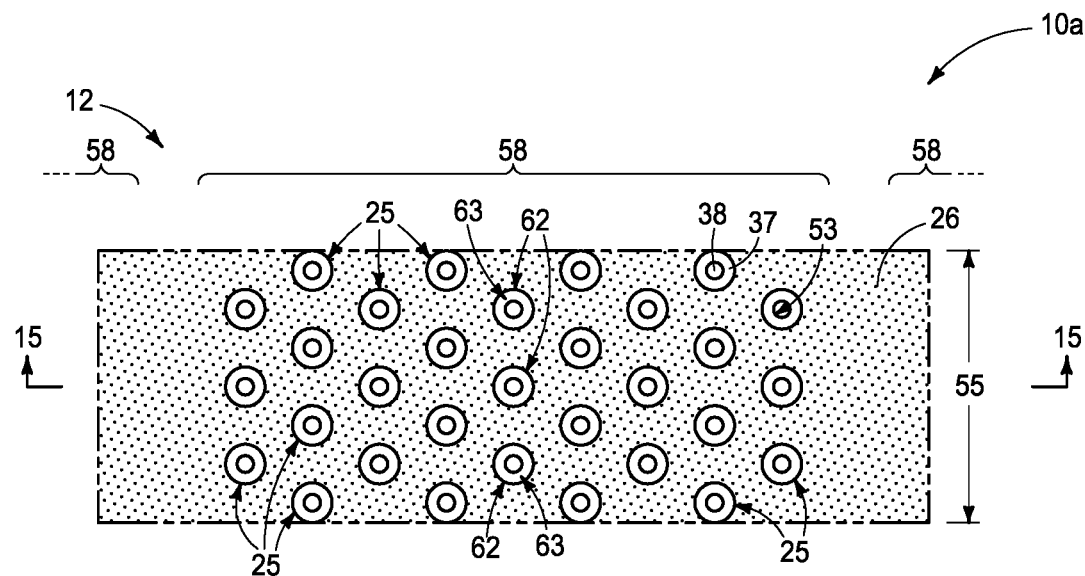
FIGS. 14-38 show alternate example method and/or structural embodiments of the invention.
Figure 15:
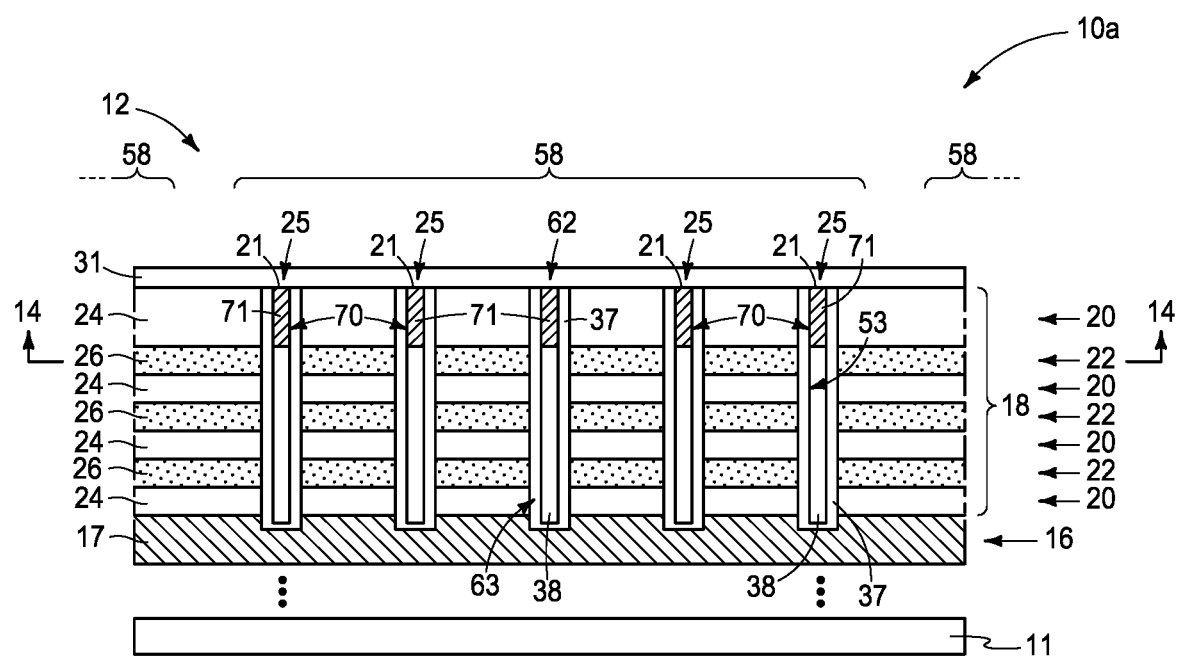

Referring to FIGS. 14 and 15, such shows processing analogous to that described above with respect to FIG. 7, but with respect to a construction 10a wherein the at least one isolation structure 95 (not shown) as shown in FIG. 7 has not been formed. Accordingly, insulator material 31 has been formed. Steps/Stairs may have been or may not have been patterned in a staircase area (not shown) before this point in processing and that is not otherwise particularly relevant to aspects of the inventions disclosed herein.

Figure 16:
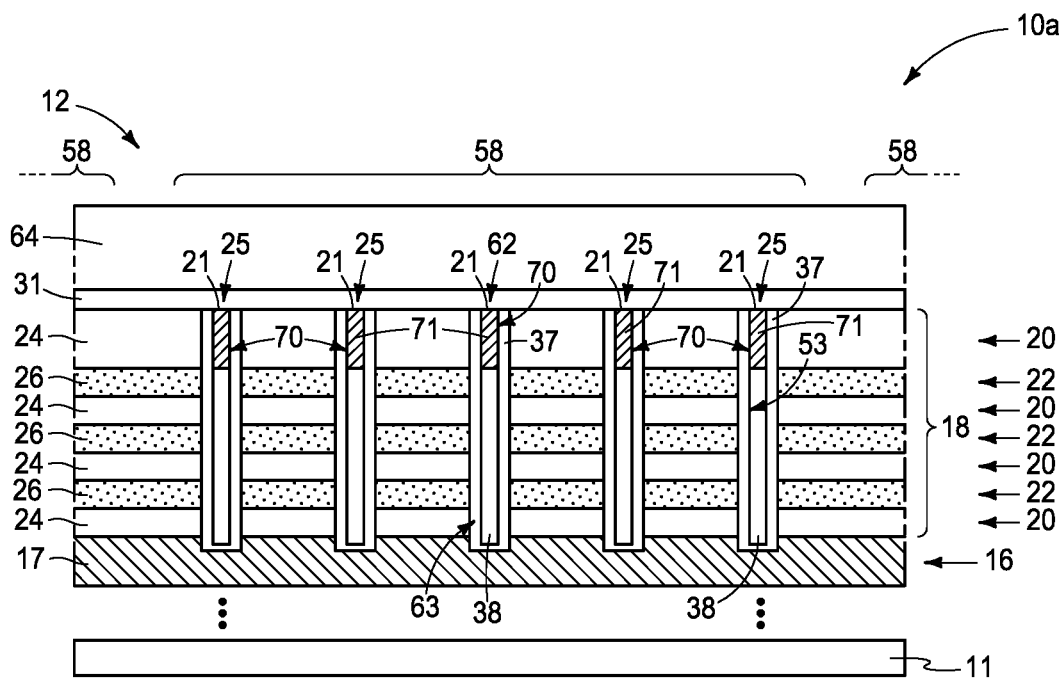

Referring to FIG. 16, second insulator material 64 has been formed directly above, in one embodiment directly against, first insulator material 31 and accordingly also directly above conductor-material contacts 70.

Figure 17:
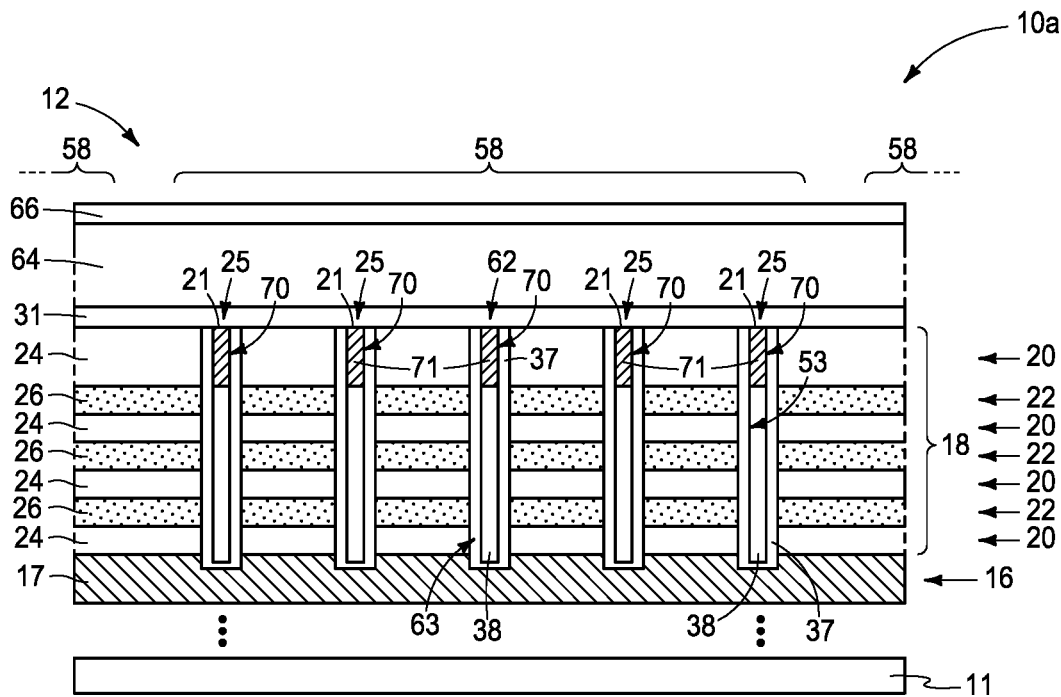

Referring to FIG. 17, third insulator material 66 has been formed directly above, and in one embodiment directly against, second insulator material 64, and thereby directly above first insulator material 31 and conductor-material contacts 70. Third insulator material comprises at least one of the (a) and (b). First insulator material 31 and third insulator material 66 may be of different compositions relative one another or alternately be of the same composition relative one another. Any attributes described above with respect to insulator material 31 apply with respect to third insulator material 66. In one embodiment, construction 10a is devoid of each of the (a) and (b) vertically between first insulator material 31 and third insulator material 66. Third insulator material 66 may optionally be wholly sacrificial.

At least one horizontally-elongated isolation structure is formed in the first and second insulator materials (regardless of whether being formed in the third insulator material) and in a top part of the stack in the individual memory-block regions. An example manner of doing so is next described with reference to FIGS. 18-23.

Figure 18:
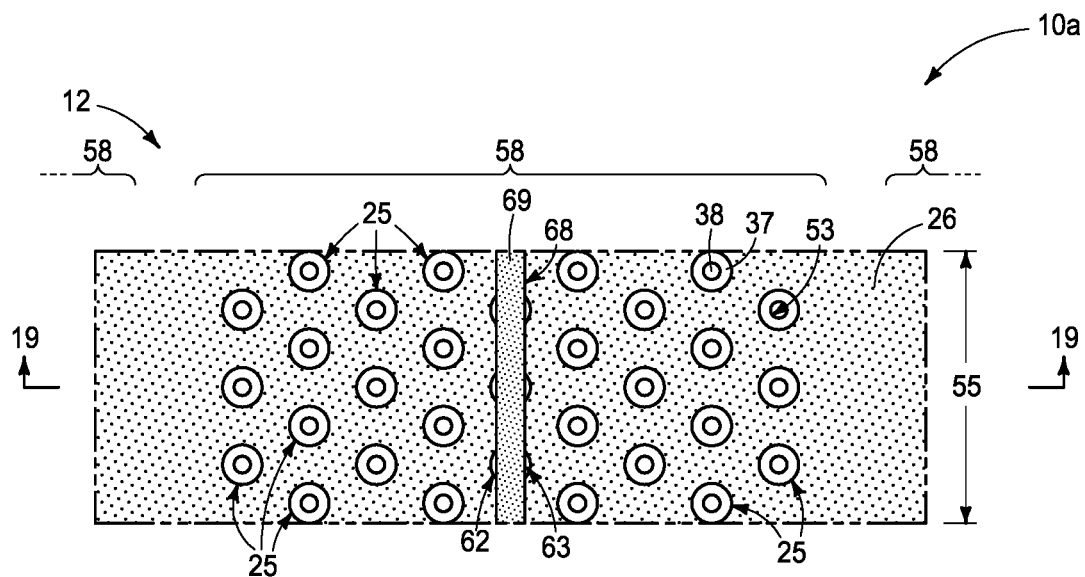
Figure 19:
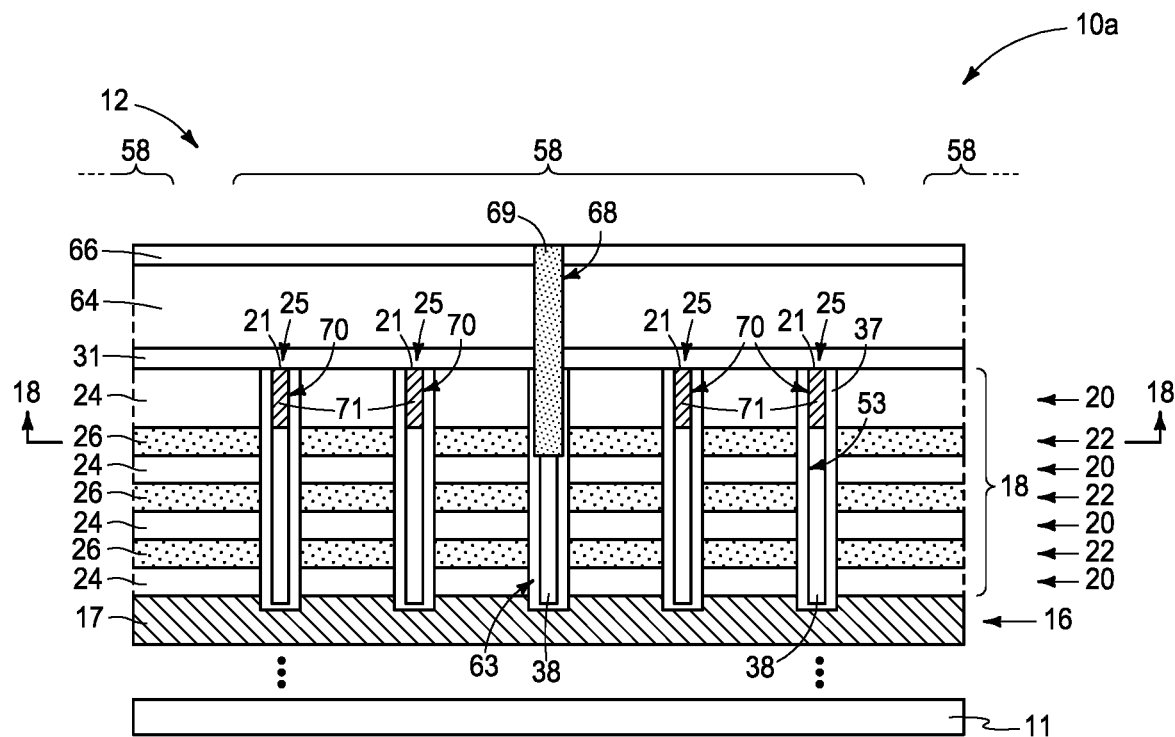

Referring to FIGS. 18 and 19, such show formation of horizontally-elongated isolation trench 68 (i.e., at least one) in first insulator material 31 and second insulator material 64 (and in third insulator material 66 when present) and in a top part of stack 18 in individual memory-block regions 58. This has been followed by forming insulator material 69 [e.g., that is devoid of each of the (a) and (b)] therein.

Figure 20:
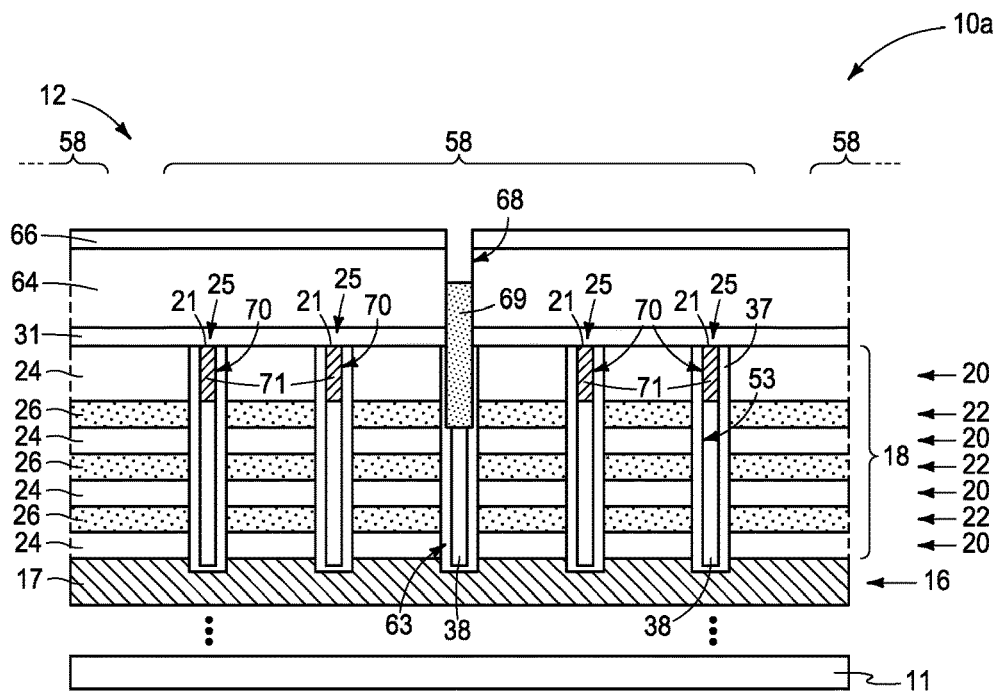

FIG. 20 shows an example embodiment wherein insulator material 69 has been vertically recessed within isolation trench 68 (e.g., by selective anisotropic etching relative to at least third insulator material 66). In some embodiments, insulator material 69 may be considered as comprising a lower horizontally-elongated insulator material 69.

Figure 21:
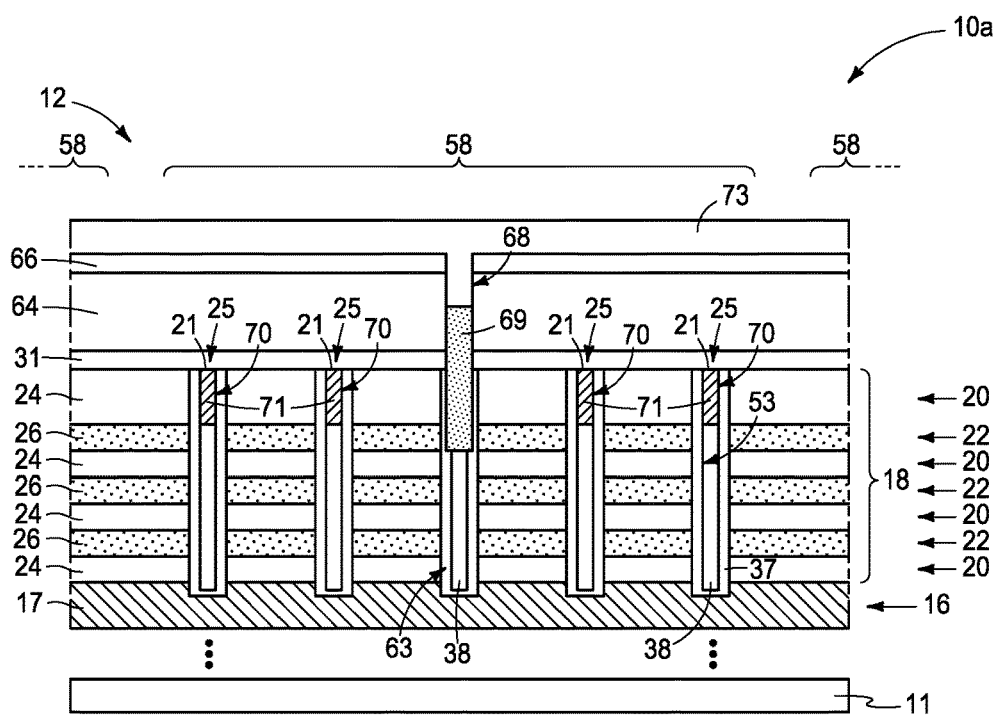

Referring to FIG. 21, an upper horizontally-elongated insulator material 73 has been formed above lower insulator material 69 and comprises at least one of the (a) and (b) (e.g., regardless of which one or both of the (a) or (b) is in third insulator material 66 or first insulator 31), with in one embodiment lower insulator material 69 being devoid of each of the (a) and (b).

Figure 22:
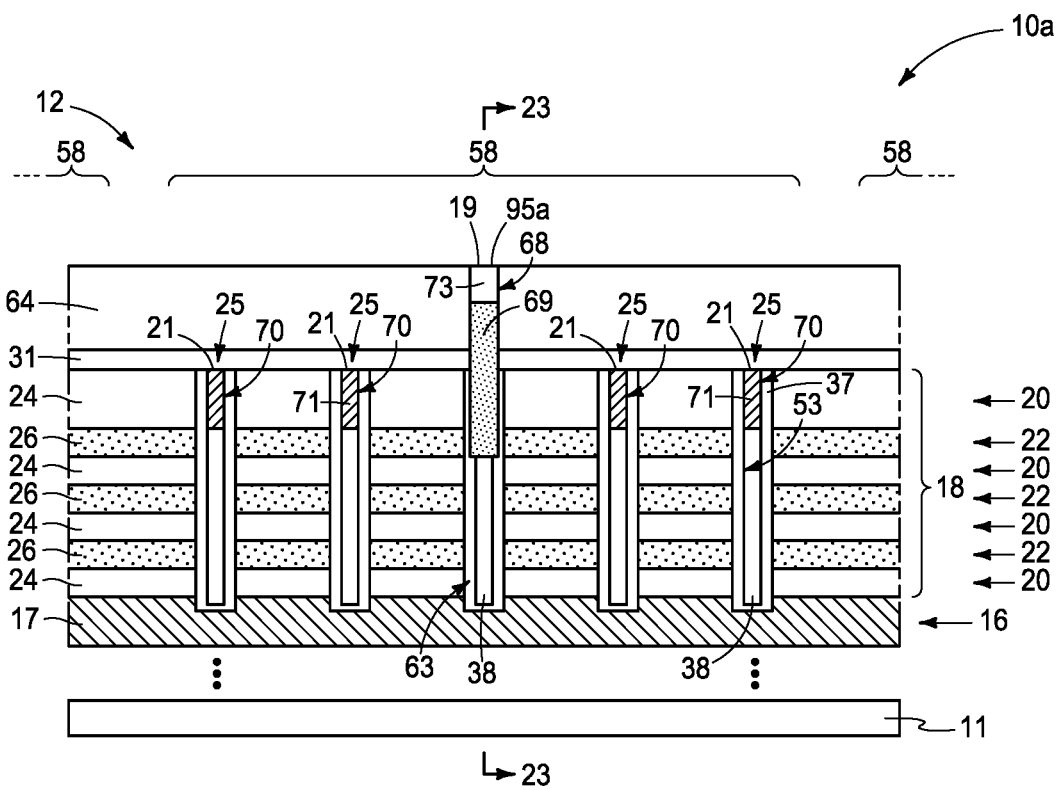
Figure 23:
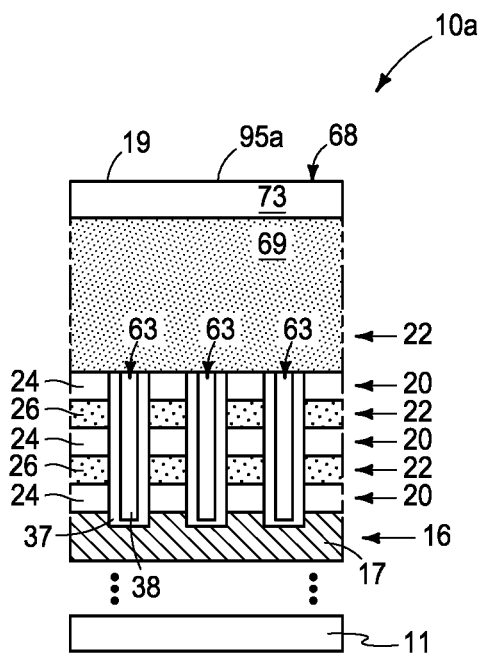

FIGS. 22 and 23 show subsequent processing whereby third insulator material 66 (not shown) and upper insulator material 73 have been removed back at least to top surfaces of second insulator material 64, thereby forming at least one horizontally-elongated isolation structure 95a in first insulator material 31 and second insulator material 64 and in top part of stack 18 in individual memory-block regions 58. In one embodiment and as shown, the at least one isolation structure 95a has been formed to have a higher top 19 than tops 21 of conductor-material contacts 70.

In some embodiments, conductive vias are formed through first insulator material 31 and second insulator material 64 (at least through such materials) that are individually directly against individual conductor-material contacts 70. FIGS. 24-28 show example additional processing analogous to that described above with respect to FIGS. 9-13.

Figure 24:
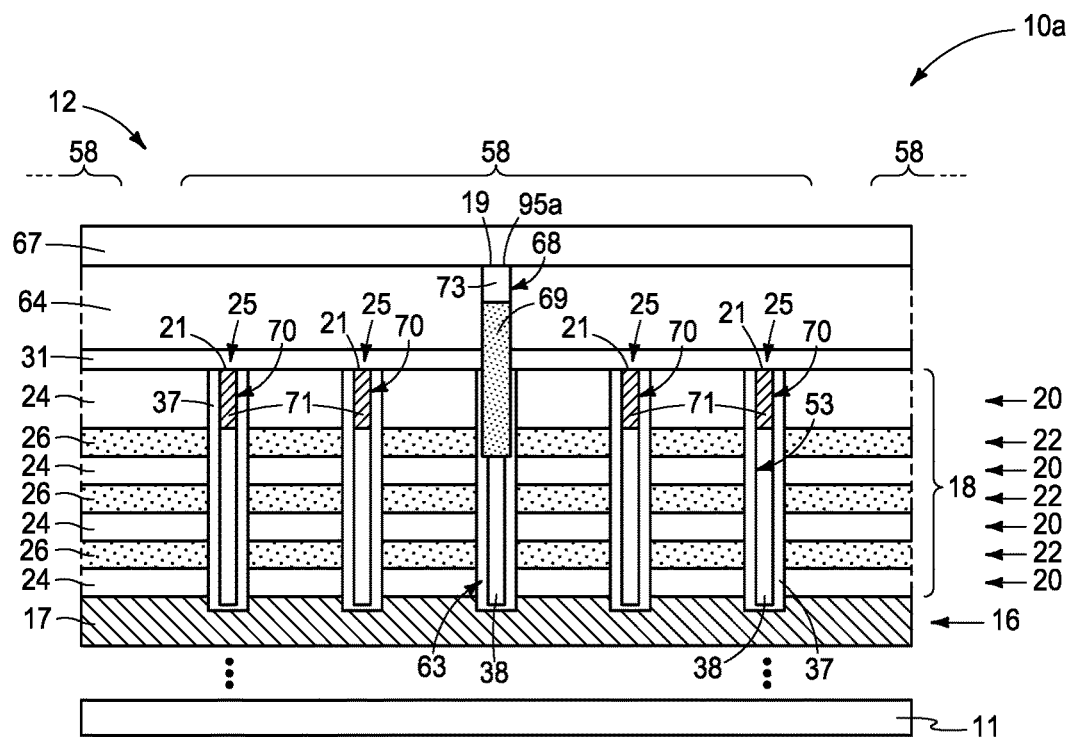

Referring to FIG. 24, a fourth insulator material 67 (e.g., that is devoid of each of the (a) and (b) and may be of the same or different composition as that of second insulator material 64) has been formed directly above, and in one embodiment directly against, second insulator material 64.

Figure 25:
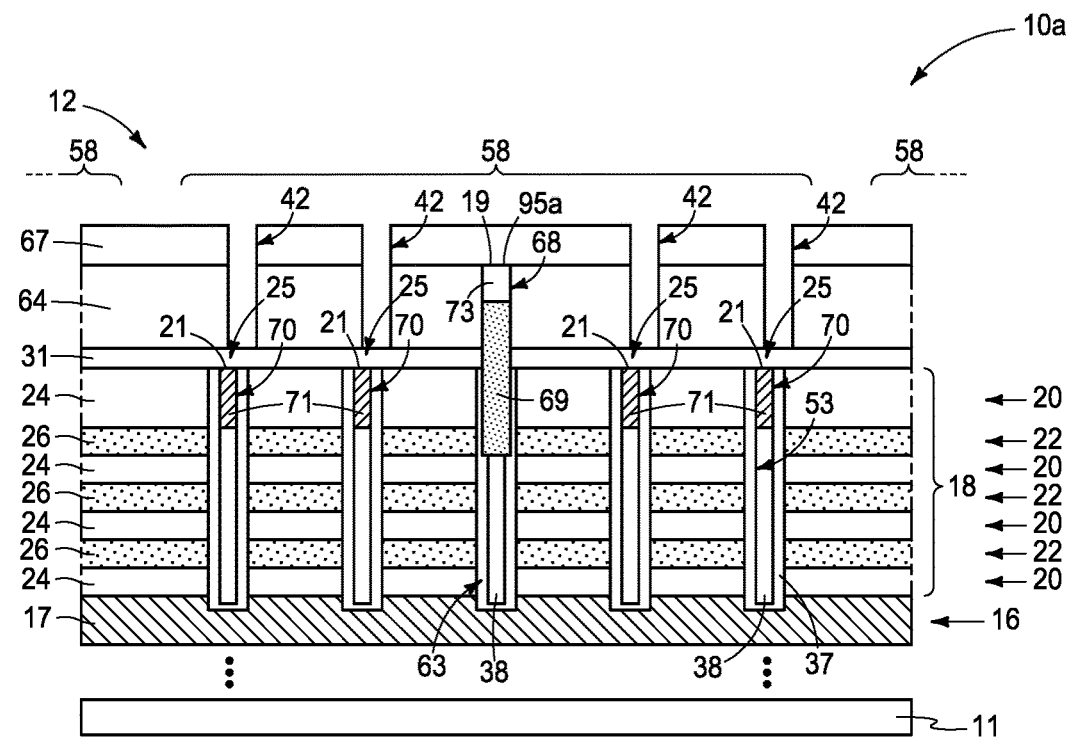

Referring to FIG. 25, conductive via openings 42 have been formed through fourth insulator material 67 and second insulator material 64, for example by anisotropic etching that has been conducted selectively relative to first insulator material 31 using a first etching chemistry (e.g., as described above) to stop on or in first insulator material 31. An acceptable right mis-alignment is shown as was in FIG. 9.

Figure 26:
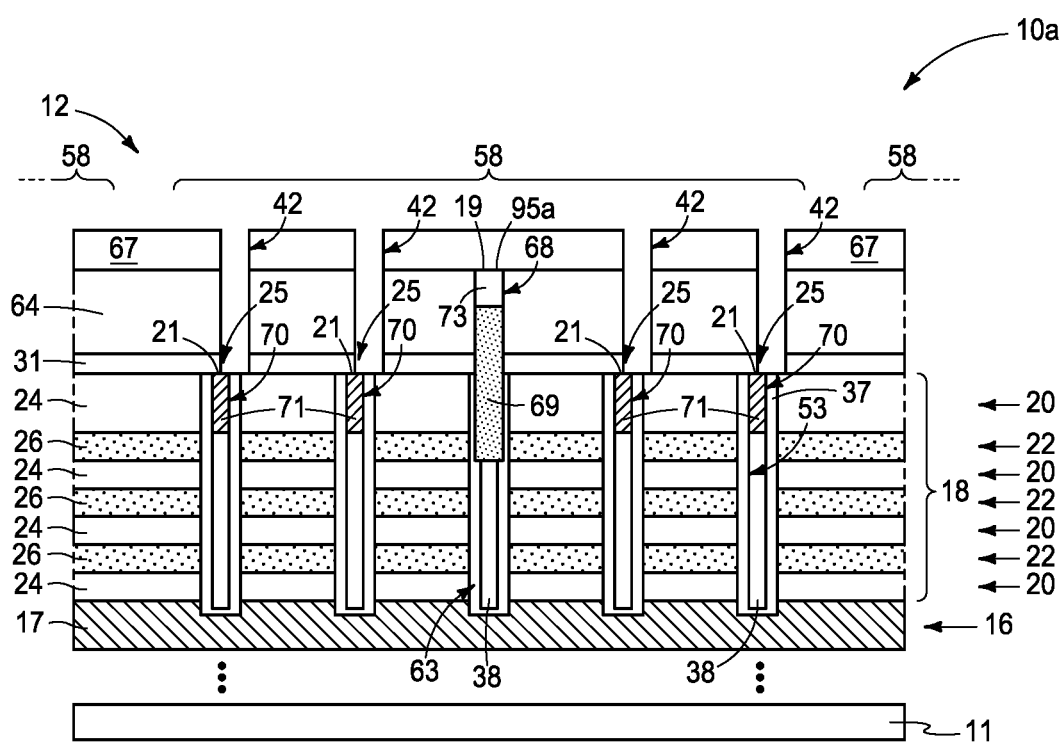

FIG. 26 shows example subsequent etching through first insulator material 31 using a second etching chemistry (e.g., as described above) that is different from the first etching chemistry to expose individual conductor-material contacts 70.

Figure 27:
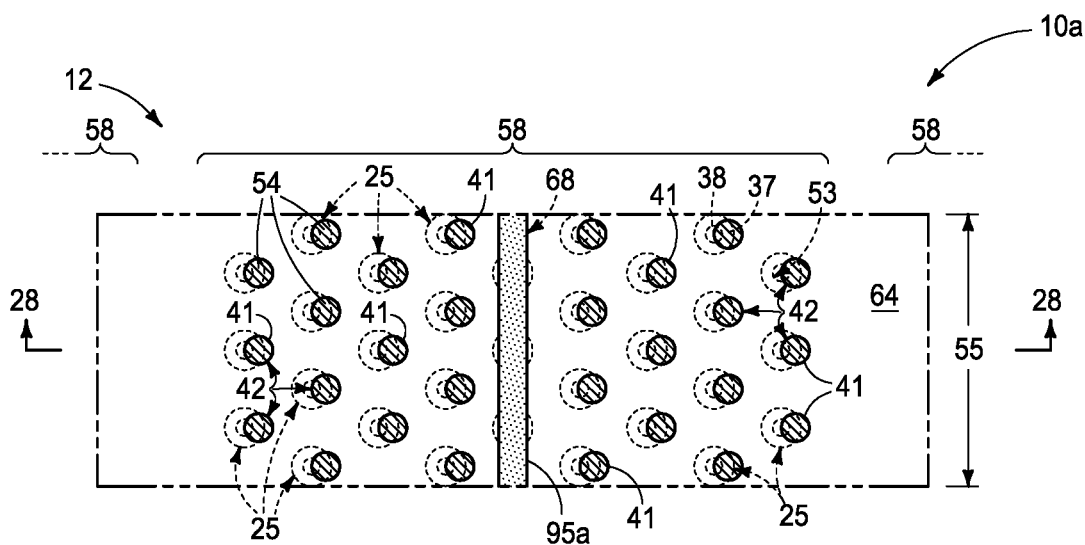
Figure 28:
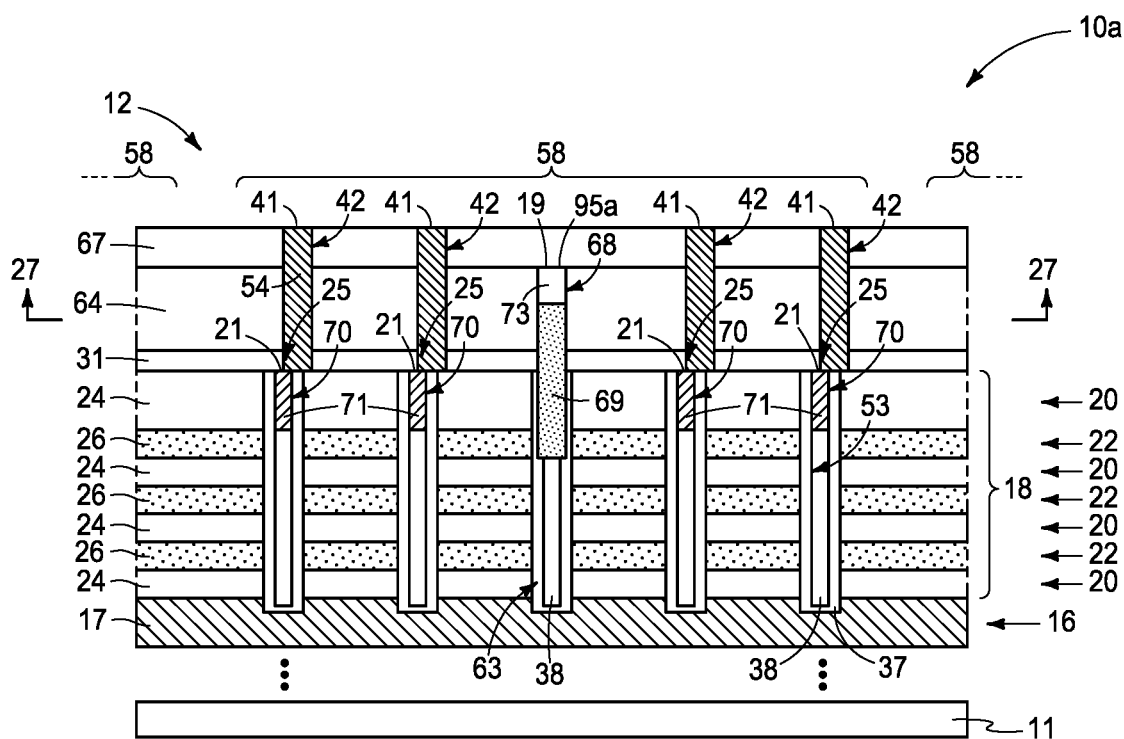

FIGS. 27 and 28 show example subsequent processing whereby conductive material 54 has been formed in conductive via openings 42 directly against individual conductor-material contacts 70, thereby forming conductive vias 41. Provision of upper insulator material 73 as comprising at least one of the (a) and (b) will provide an over-etch protection in the event of mis-alignment of conductive via openings 42 such that they overlap isolation structures 95. Such may inadvertently occur, for example, where conductive via openings 42 are considerably larger in horizontal cross-sectional area than conductor-material contacts 70 (not shown).

As alluded to above, method embodiments of the invention may use what is commonly referred to as a gate-first processing or a gate-last processing. The following is a description of example gate-last processing, and which may occur earlier among any of the processing described above. The example proceeds with respect to construction 10a as of course may as well occur with respect to construction 10 or other constructions.

Figure 29:
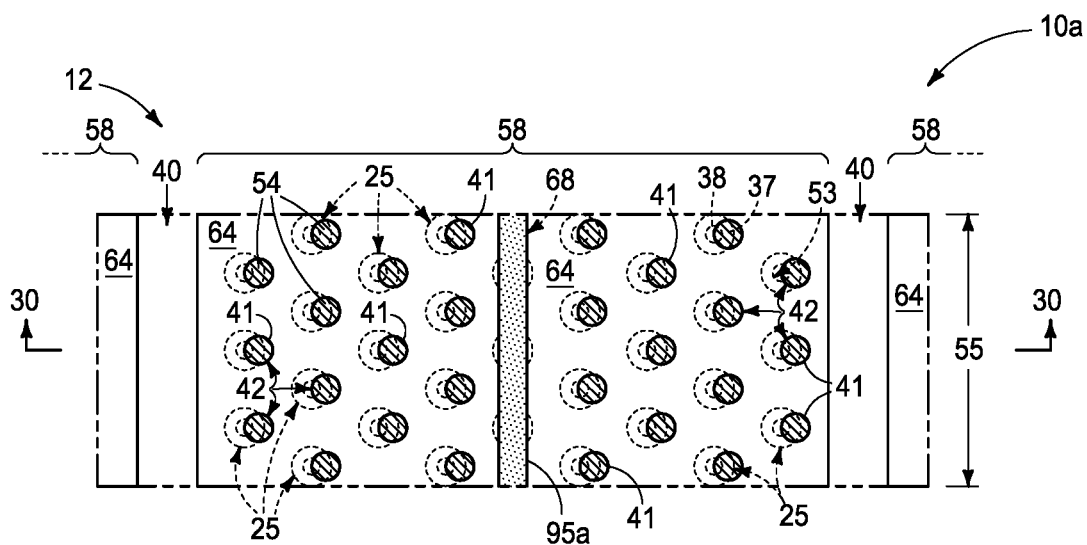
Figure 30:
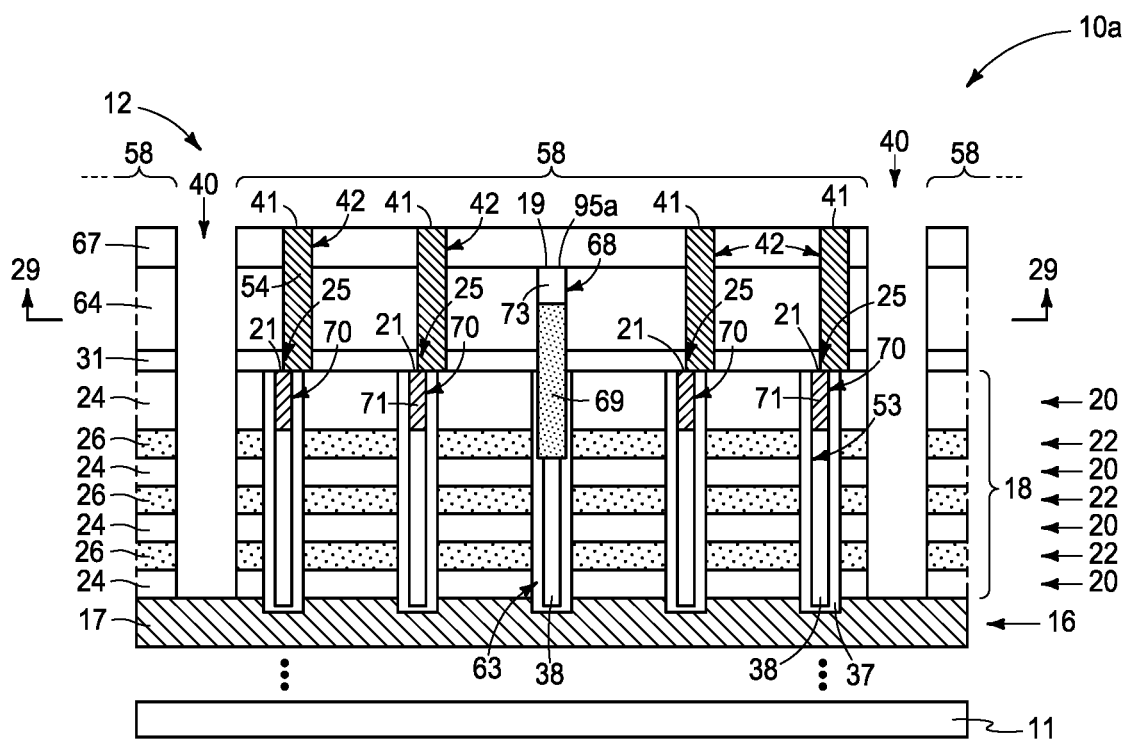
Figure 31:
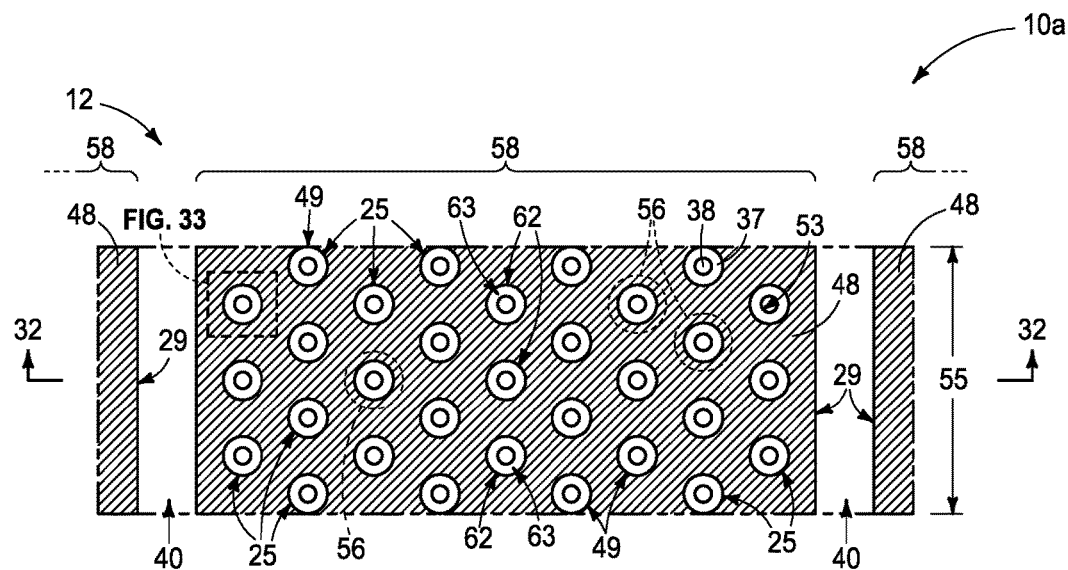
Figure 32:
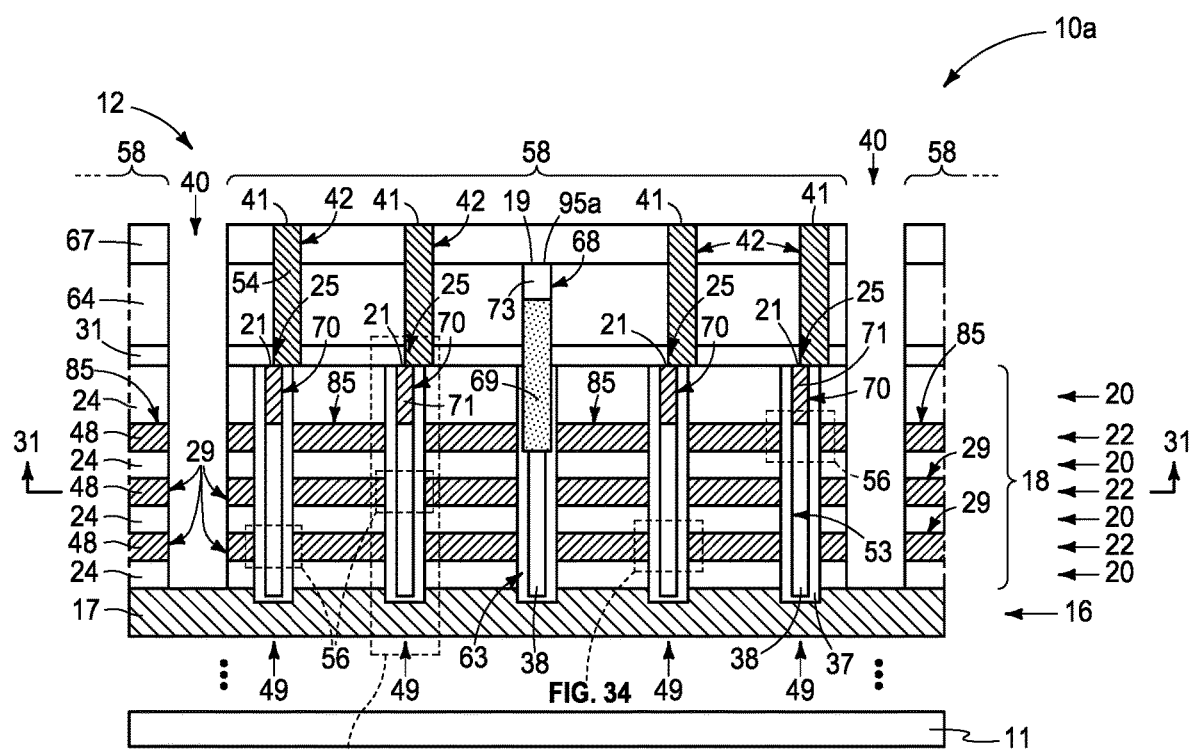
Figure 33:
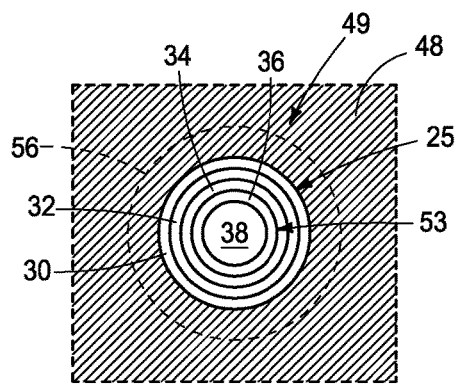
Figure 34:
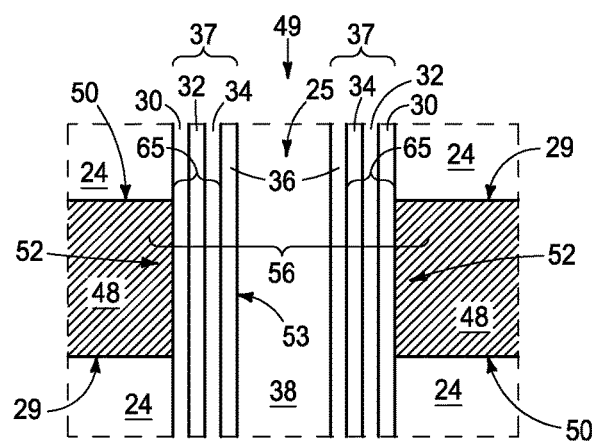
Figure 35:
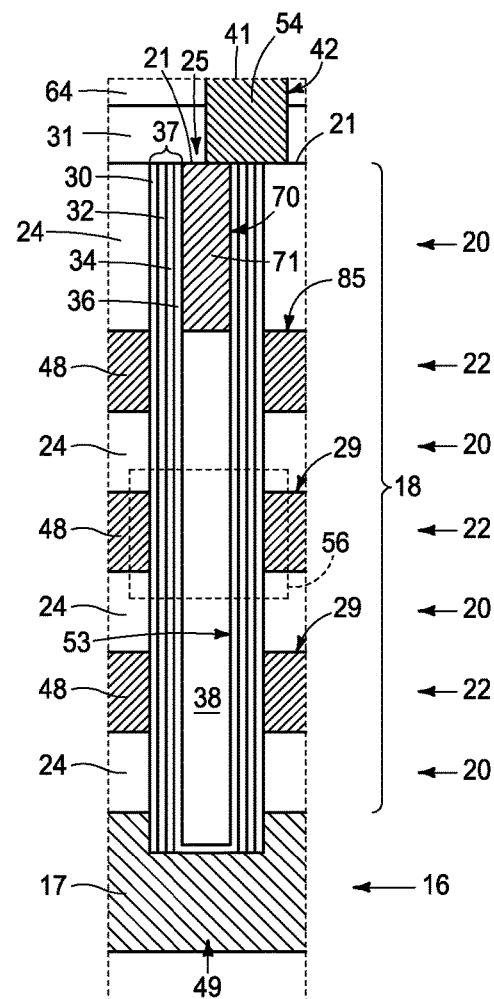

Referring to FIGS. 29 and 30, horizontally-elongated trenches 40 have been formed (e.g., by anisotropic etching) into stack 18 to form laterally-spaced memory-block regions 58. Trenches 40 may have respective bottoms that are directly against conductor material 17 (atop or within) of conductor tier 16 (as shown) or may have respective bottoms that are elevationally-coincident with or below the bottom or conductor material 17 of conductor tier 16 (not shown).

Referring to FIGS. 31-35, and in one embodiment, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 34 and some with dashed outlines in FIGS. 31, 32, 33, and 35, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 34) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Example isolation structure 95a is laterally-between two immediately-laterally-adjacent select gates 85 in the individual memory blocks 58 in the depicted example.

Figure 36:
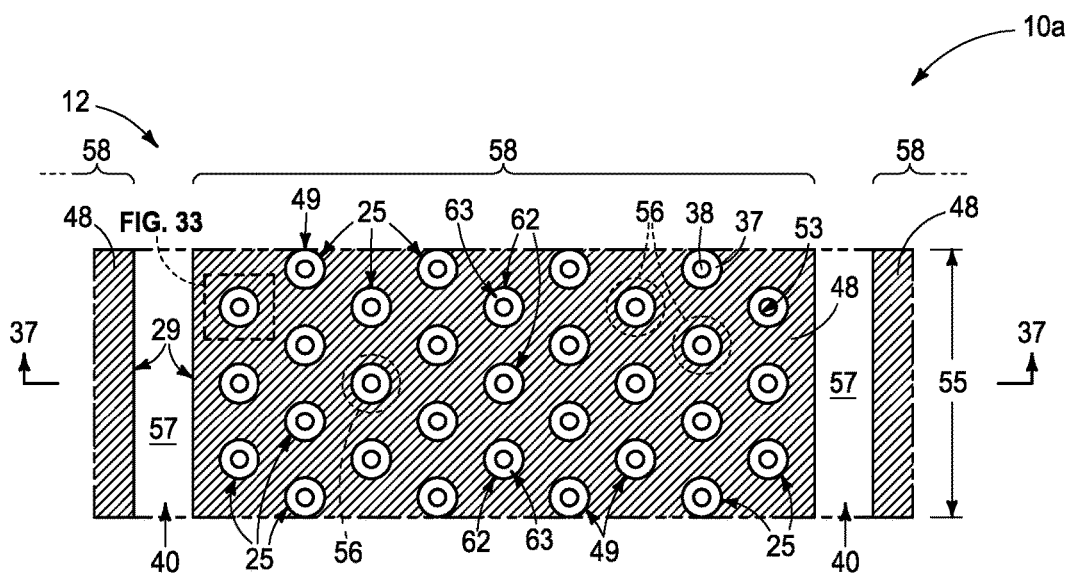
Figure 37:
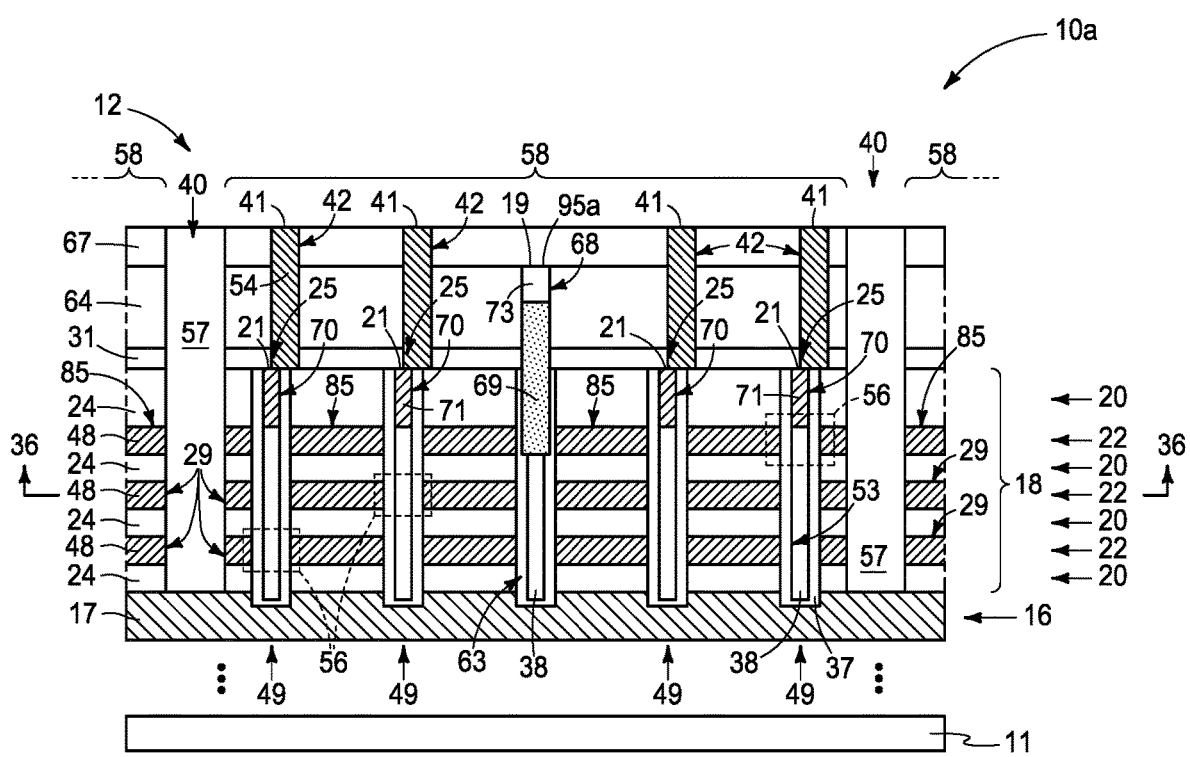

Referring to FIGS. 36 and 37, and in one embodiment, intervening material 57 has been formed in trenches 40 laterally-between and longitudinally-along immediately-laterally-adjacent memory-block regions 58. Intervening material 57 may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include TAVs (not shown).

Figure 38:
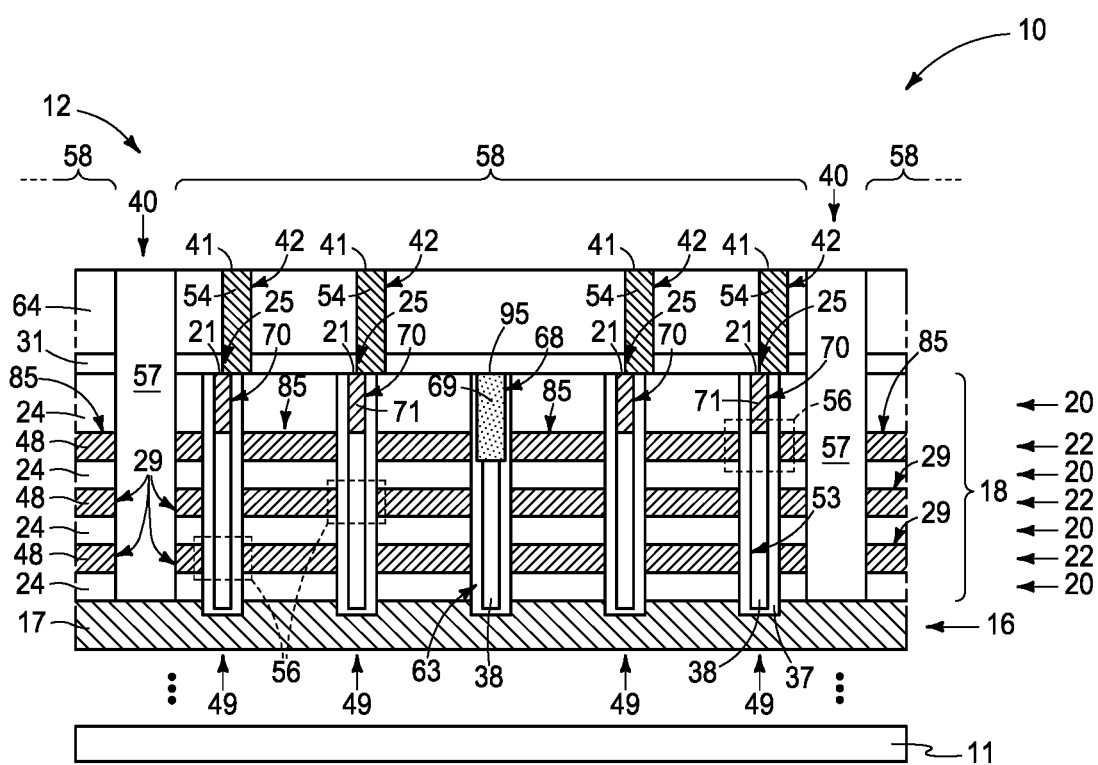

FIG. 38 shows example construction 10 corresponding to construction 10a of FIG. 37.

Any other attribute(s) or aspect(s) as shown and/or described herein with respect to other embodiments may be used in the embodiments shown and described with reference to the above embodiments.

An embodiment of the invention encompasses a method used in forming a memory array (e.g., 12) comprising strings (e.g., 49) of memory cells (e.g., 56). Such a method comprises forming a stack (e.g., 18) comprising vertically-alternating first tiers (e.g., 22) and second tiers (e.g., 20) having channel-material strings (e.g., 53) therein. Conductor-material contacts (e.g., 70) are directly against the channel material (e.g., 36) of the individual channel-material strings. First insulator material (e.g., 31) is formed directly above the conductor-material contacts and comprises at least one of the (a) and (b). Second insulator material (e.g., 64) is formed directly above the first insulator material and the conductor-material contacts and is devoid of each of the (a) and (b). Third insulator material (e.g., 66) is formed directly above the second insulator material, the first insulator material, and the conductor-material contacts. The third insulator material comprises at least of the (a) and (b). Conductive vias (e.g., 41) are formed through the first and second insulator materials that are individually directly against the individual conductor-material contacts (regardless of whether at least one horizontally-elongated isolation structure is formed and if so when so formed).

In one embodiment, at least one horizontally-elongated isolation structure (e.g., 95, 95a) is formed through the first, second, and third insulator materials and in a top part of stack 18 in individual memory-block regions (e.g., 58).

Any other attribute(s) or aspect(s) as shown and/or described herein with respect to other embodiments may be used.

An embodiment of the invention includes a method used in forming a memory array (e.g., 12) comprising strings (e.g., 49) of memory cells (e.g., 56). Such a method comprises forming a stack (e.g., 18) comprising vertically-alternating first tiers (e.g., 22) and second tiers (e.g., 20) comprising memory-block regions (e.g., 58) having channel-material strings (e.g., 49) therein (regardless of whether comprising conductor-material contacts). At least one horizontally-elongated isolation structure (e.g., 95a) is formed in a top part of the stack in individual of the memory-block regions. The isolation structure comprises a lower horizontally-elongated insulator material (e.g., 69) and an upper horizontally-elongated insulator material (e.g., 73) thereabove. The upper insulator material comprises at least one of the (a) and (b). The lower insulator material is devoid of each of the (a) and (b). Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) are in the stack. Conductor-material contacts (e.g., 70) are directly against the channel material (e.g., 36) of individual of the channel-material strings. Insulator material (e.g., 31) is directly against tops (e.g., 21) of the conductor-material contacts. The insulator material comprises at least one of the (a) and (b). Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 49) of memory cells (e.g., 56) are in the stack (regardless of presence of conductive-material contacts). At least one horizontally-elongated isolation structure (e.g., 95a) is in a top part of the stack in individual of the memory blocks. The isolation structure comprises a lower horizontally-elongated insulator material (e.g., 69) and an upper horizontally-elongated insulator material (e.g., 73) there-above. The upper insulator material comprises at least one of the (a) and (b). The lower insulator material is devoid of each of the (a) and (b). The at least one isolation structure is laterally-between two immediately-laterally-adjacent select gates (e.g., 85) in the individual memory blocks. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers comprising memory-block regions having channel-material strings therein. Conductor-material contacts are directly against the channel material of individual of the channel-material strings. First insulator material is formed directly above the conductor-material contacts. The first insulator material comprises at least one of (a) and (b), where (a): silicon, nitrogen, and one or more of carbon, oxygen, boron, and phosphorus, and (b): silicon carbide. Second insulator material is formed directly above the first insulator material and the conductor-material contacts. The second insulator material is devoid of each of the (a) and (b). Third insulator material is formed directly above the second insulator material, the first insulator material, and the conductor-material contacts. The third insulator material comprises at least one of the (a) and (b). At least one horizontally-elongated isolation structure is formed in the first and second insulator materials and in a top part of the stack in individual of the memory-block regions.

In some embodiments, a method used in forming a memory array comprising strings of memory cells comprises forming a stack comprising vertically-alternating first tiers and second tiers having channel-material strings therein. Conductor-material contacts are directly against the channel material of individual of the channel-material strings. First insulator material is formed directly above the conductor-material contacts. The first insulator material comprises at least one of (a) and (b), where (a): silicon, nitrogen, and one or more of carbon, oxygen, boron, and phosphorus, and (b): silicon carbide. Second insulator material is formed directly above the first insulator material and the conductor-material contacts. The second insulator material is devoid of each of the (a) and (b). Third insulator material is formed directly above the second insulator material, the first insulator material, and the conductor-material contacts. The third insulator material comprises at least one of the (a) and (b). Conductive vias are formed through the first and second insulator materials that are individually directly against individual of the conductor-material contacts.

In some embodiments, a method used in forming a memory array comprising strings of memory cells comprises forming a stack comprising vertically-alternating first tiers and second tiers comprising memory-block regions having channel-material strings therein. At least one horizontally-elongated isolation structure is formed in a top part of the stack in individual of the memory-block regions. The isolation structure comprises a lower horizontally-elongated insulator material and an upper horizontally-elongated insulator material there-above. The upper insulator material comprises at least one of (a) and (b), where (a): silicon, nitrogen, and one or more of carbon, oxygen, boron, and phosphorus, and (b): silicon carbide. The lower insulator material is devoid of each of the (a) and (b).

In some embodiments, a method used in forming a memory array comprising strings of memory cells comprises forming a stack comprising vertically-alternating first tiers and second tiers comprising memory-block regions having channel-material strings therein. Conductor-material contacts are directly against the channel material of individual of the channel-material strings. At least one horizontally-elongated isolation structure is in a top part of the stack in individual of the memory-block regions. Insulator material is formed directly above the conductor-material contacts and the at least one isolation structure. The insulator material comprises at least one of (a) and (b), where (a): silicon, nitrogen, and one or more of carbon, oxygen, boron, and phosphorus, and (b): silicon carbide. Conductive vias are formed through the insulator material that are individually directly against individual of the conductor-material contacts.

In some embodiments, a memory array comprising strings of memory cells comprises laterally-spaced memory blocks individually comprising a vertical stack comprising alternating insulative tiers and conductive tiers. Channel-material strings of memory cells are in the stack. Conductor-material contacts are directly against the channel material of individual of the channel-material strings. An insulator material is directly against tops of the conductor-material contacts. The insulator material comprises at least one of (a) and (b), where (a): silicon, nitrogen, and one or more of carbon, oxygen, boron, and phosphorus, and (b): silicon carbide.

In some embodiments, a memory array comprising strings of memory cells comprises laterally-spaced memory blocks individually comprising a vertical stack comprising alternating insulative tiers and conductive tiers. Channel-material strings of memory cells are in the stack. At least one horizontally-elongated isolation structure is in a top part of the stack in individual of the memory blocks. The isolation structure comprises a lower horizontally-elongated insulator material and an upper horizontally-elongated insulator material there-above. The upper insulator material comprises at least one of (a) and (b), where (a): silicon, nitrogen, and one or more of carbon, oxygen, boron, and phosphorus, and (b): silicon carbide. The lower insulator material is devoid of each of the (a) and (b).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
  forming a stack comprising vertically-alternating first tiers and second tiers comprising memory-block regions having channel-material strings therein, conductor-material contacts being directly against the channel material of individual of the channel-material strings;
  forming first insulator material directly above the conductor-material contacts, the first insulator material comprising at least one of (a) and (b), where (a): silicon, nitrogen, and one or more of carbon, oxygen, boron, and phosphorus, and (b): silicon carbide;
  forming second insulator material directly above the first insulator material and the conductor-material contacts, the second insulator material being devoid of each of the (a) and (b);
  forming third insulator material directly above the second insulator material, the first insulator material, and the conductor-material contacts; the third insulator material comprising at least one of the (a) and (b); and
  forming at least one horizontally-elongated isolation structure in the first and second insulator materials and in a top part of the stack in individual of the memory-block regions.

2. The method of claim 1 wherein the first insulator material is directly against the conductor-material contacts.

3. The method of claim 1 wherein the second insulator material is directly against the first insulator material.

4. The method of claim 1 wherein the third insulator material is directly against the second insulator material.

5. The method of claim 1 wherein:
  the first insulator material is directly against the conductor-material contacts;
  the second insulator material is directly against the first insulator material; and
  the third insulator material is directly against the second insulator material.

6. The method of claim 1 wherein the first and third insulator materials are of different compositions relative one another.

7. The method of claim 1 wherein the first and third insulator materials are of the same composition relative one another.

8. The method of claim 1 being devoid of each of the (a) and (b) vertically between the first and third insulator materials.

9. The method of claim 1 wherein the first insulator material comprises the (a).

10. The method of claim 1 wherein the first insulator material comprises the (b).

11. The method of claim 1 wherein the third insulator material comprises the (a).

12. The method of claim 1 wherein the third insulator material comprises the (b).

13. The method of claim 1 wherein the first tiers comprise sacrificial material, and further comprising:
  forming horizontally-elongated trenches into the stack between the memory-block regions;
  through the trenches, isotropically etching away and replacing the sacrificial material that is in the first tiers with conducting material of individual conductive lines; and
  forming intervening material in the trenches laterally-between and longitudinally-along immediately-laterally-adjacent of the memory-block regions.

14. The method of claim 1 comprising forming conductive vias through the first and second insulator materials that are individually directly against individual of the conductor-material contacts.

15. The method of claim 1 comprising forming the at least one isolation structure to have a higher top than tops of the conductor-material contacts.

16. The method of claim 1 wherein the isolation structure comprises a lower horizontally-elongated insulator material and an upper horizontally-elongated insulator material there-above, the upper insulator material comprising at least one of the (a) and (b), the lower insulator material being devoid of each of the (a) and (b).

17. The method of claim 14 wherein forming the conductive vias comprises:
  after forming the isolation structure, forming conductive via openings through the second and first insulator materials to individual of the conductor-material contacts; and
  forming conductive material in the conductive via openings that is directly against the individual conductor-material contacts to form conductive vias.

18. The method of claim 17 wherein forming the conductive via openings comprises:
  anisotropically etching through the second insulator material selectively relative to the first insulator material using a first etching chemistry to stop on or in the first insulator material; and
  etching through the first insulator material using a second etching chemistry that is different from the first etching chemistry to expose the individual conductor-material contacts.

19. A method used in forming a memory array comprising strings of memory cells, comprising:
  forming a stack comprising vertically-alternating first tiers and second tiers having channel-material strings therein, conductor-material contacts being directly against the channel material of individual of the channel-material strings;
  forming first insulator material directly above the conductor-material contacts, the first insulator material comprising at least one of (a) and (b), where (a): silicon, nitrogen, and one or more of carbon, oxygen, boron, and phosphorus, and (b): silicon carbide;
  forming second insulator material directly above the first insulator material and the conductor-material contacts, the second insulator material being devoid of each of the (a) and (b);
  forming third insulator material directly above the second insulator material, the first insulator material, and the conductor-material contacts; the third insulator material comprising at least one of the (a) and (b); and
forming conductive vias through the first and second insulator materials that are individually directly against individual of the conductor-material contacts.

20. The method of claim 19 wherein forming the conductive vias comprises:
forming conductive via openings through the second and first insulator materials to individual of the conductor-material contacts; and
forming conductive material in the conductive via openings that is directly against the individual conductor-material contacts.

21. The method of claim 19 wherein the alternating first and second tiers comprise memory-block regions, and further comprising:
forming at least one horizontally-elongated isolation structure through the first and second insulator materials and in a top part of the stack in individual of the memory-block regions.

22. The method of claim 20 comprising removing the third insulator material before forming the conductive via openings whereby the conductive via openings are not formed through the third insulator material.

23. The method of claim 20 wherein forming the conductive via openings comprises:
anisotropically etching through the second insulator material selectively relative to the first insulator material using a first etching chemistry to stop on or in the first insulator material; and
etching through the first insulator material using a second etching chemistry that is different from the first etching chemistry to expose the individual conductor-material contacts.

24. The method of claim 21 comprising forming the isolation structure to comprise a lower horizontally-elongated insulator material and an upper horizontally-elongated insulator material there-above, the upper insulator material comprising at least one of the (a) and (b), the lower insulator material being devoid of each of the (a) and (b).

25. The method of claim 21 comprising forming the at least one isolation structure to have a higher top than tops of the conductor-material contacts.

26. A method used in forming a memory array comprising strings of memory cells, comprising:
forming a stack comprising vertically-alternating first tiers and second tiers comprising memory-block regions having channel-material strings therein; and
forming at least one horizontally-elongated isolation structure in a top part of the stack in individual of the memory-block regions, the isolation structure comprising a lower horizontally-elongated insulator material and an upper horizontally-elongated insulator material there-above, the upper insulator material comprising at least one of (a) and (b), where (a): silicon, nitrogen, and one or more of carbon, oxygen, boron, and phosphorus, and (b): silicon carbide, the lower insulator material being devoid of each of the (a) and (b).

27. The method of claim 26 wherein the first insulator material comprises the (a).

28. The method of claim 26 wherein the first insulator material comprises the (b).

29. A method used in forming a memory array comprising strings of memory cells, comprising:
forming a stack comprising vertically-alternating first tiers and second tiers comprising memory-block regions having channel-material strings therein, conductor-material contacts being directly against the channel material of individual of the channel-material strings, at least one horizontally-elongated isolation structure in a top part of the stack in individual of the memory-block regions;
forming insulator material directly above the conductor-material contacts and the at least one isolation structure, the insulator material comprising at least one of (a) and (b), where (a): silicon, nitrogen, and one or more of carbon, oxygen, boron, and phosphorus, and (b): silicon carbide; and
forming conductive vias through the insulator material that are individually directly against individual of the conductor-material contacts.

30. The method of claim 29 wherein the insulator material is directly against the conductor-material contacts.

31. The method of claim 29 wherein the insulator material is directly against the at least one isolation structure.

32. The method of claim 29 wherein, the insulator material is directly against the conductor-material contacts; and
the insulator material is directly against the at least one isolation structure.

33. The method of claim 29 wherein the insulator material comprises the (a).

34. The method of claim 29 wherein the insulator material comprises the (b).

35. The method of claim 29 comprising forming insulating material directly above the insulator material, the insulating material being devoid of each of the (a) and (b), the forming of the conductive vias comprising:
forming conductive via openings through the insulating material and the insulator material to individual of the conductor-material contacts; and
forming conductive material in the conductive via openings that is directly against the individual conductor-material contacts; and
the forming of the conductive via openings comprising:
anisotropically etching through the insulating material selectively relative to the insulator material using a first etching chemistry to stop on or in the insulator material; and
etching through the insulator material using a second etching chemistry that is different from the first etching chemistry to expose the individual conductor-material contacts.

36. A memory array comprising strings of memory cells, comprising:
laterally-spaced memory blocks individually comprising a vertical stack comprising alternating insulative tiers and conductive tiers, channel-material strings of memory cells in the stack, conductor-material contacts being directly against the channel material of individual of the channel-material strings; and
an insulator material directly against tops of the conductor-material contacts, the insulator material comprising at least one of (a) and (b), where (a): silicon, nitrogen, and one or more of carbon, oxygen, boron, and phosphorus, and (b): silicon carbide.

37. The memory array of claim 36 wherein the insulator material comprises the (a).

38. The memory array of claim 36 wherein the insulator material comprises the (b).

39. A memory array comprising strings of memory cells, comprising:
laterally-spaced memory blocks individually comprising a vertical stack comprising alternating insulative tiers and conductive tiers, channel-material strings of memory cells in the stack; and at least one horizontally-elongated isolation structure in a top part of the stack in individual of the memory blocks, the isolation structure comprising a lower horizontally-elongated insulator material and an upper horizontally-elongated insulator material there-above, the upper insulator material comprising at least one of (a) and (b), where (a): silicon, nitrogen, and one or more of carbon, oxygen, boron, and phosphorus, and (b): silicon carbide, the lower insulator material being devoid of each of the (a) and (b).

40. The memory array of claim 39 wherein the upper insulator material comprises the (a).

41. The memory array of claim 39 wherein the upper insulator material comprises the (b).

42. The memory array of claim 39 wherein the at least one isolation structure is laterally-between two immediately-laterally adjacent select gates in the individual memory blocks.

* * * * *